United States Patent
Lee et al.

(10) Patent No.: US 7,582,501 B2
(45) Date of Patent: Sep. 1, 2009

(54) THIN FILM TRANSISTOR PANEL AND MANUFACTURING METHOD THEREOF

(75) Inventors: Jae-Kyeong Lee, Yongin-si (KR); Kwan-Tack Lim, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 243 days.

(21) Appl. No.: 11/724,982

(22) Filed: Mar. 15, 2007

(65) Prior Publication Data

US 2007/0215876 A1 Sep. 20, 2007

(30) Foreign Application Priority Data

Mar. 15, 2006 (KR) .................. 10-2006-0023946

(51) Int. Cl.
*H01L 21/00* (2006.01)
*H01L 31/036* (2006.01)
*H01L 31/112* (2006.01)

(52) U.S. Cl. .................. 438/57; 257/72
(58) Field of Classification Search .............. 438/57, 438/157, 176, 675; 257/72, 347
See application file for complete search history.

(56) References Cited

U.S. PATENT DOCUMENTS

| | | | |
|---|---|---|---|
| 5,978,058 A | 11/1999 | Sung | |
| 6,579,749 B2 | 6/2003 | Takechi | |
| 7,138,655 B2 * | 11/2006 | Tak et al. | 257/59 |
| 7,205,570 B2 * | 4/2007 | Kim et al. | 257/72 |
| 7,226,822 B2 * | 6/2007 | Takayama et al. | 438/151 |
| 2006/0076562 A1 * | 4/2006 | Lee et al. | 257/72 |

FOREIGN PATENT DOCUMENTS

| | | |
|---|---|---|
| JP | 11-121759 | 4/1999 |
| JP | 2002-261078 | 9/2002 |
| JP | 2004-170724 | 6/2004 |
| JP | 2004-214581 | 7/2004 |
| JP | 2005-292768 | 10/2005 |
| KR | 10-0307052 | 8/2001 |

(Continued)

OTHER PUBLICATIONS

English Language Abstract, JP Patent First Publication No. 11-121759, Apr. 30, 1999, 1 page.

(Continued)

*Primary Examiner*—Calvin Lee
(74) *Attorney, Agent, or Firm*—Haynes and Boone, LLP

(57) ABSTRACT

A TFT array panel having signal lines of low resistivity is presented. The TFT array panel includes a substrate; a gate line including a gate electrode formed on the substrate and having a single-layered structure; a gate insulating layer formed on the gate line; a semiconductor layer formed on the gate insulating layer; a barrier layer formed on the semiconductor layer and including nitrogen; a data line including a source electrode formed on the barrier layer and having a single-layered structure; a drain electrode formed on the barrier layer, spaced apart from the source electrode and having a single-layered structure; and a pixel electrode electrically connected to the drain electrode. The TFT array panel may include contact holes extending to the end portions of the gate line, the data line, and the drain electrode, and molybdenum or molybdenum alloy buffer members in the contact holes.

20 Claims, 33 Drawing Sheets

FOREIGN PATENT DOCUMENTS

| | | |
|---|---|---|
| KR | 1020010082837 | 8/2001 |
| KR | 1020010096804 | 11/2001 |
| KR | 1020030010023 | 2/2003 |
| KR | 1020030042081 | 5/2003 |
| KR | 1020050068611 | 7/2005 |

OTHER PUBLICATIONS

English Language Abstract, JP Patent First Publication No. 2002-261078, Sep. 13, 2002, 1 page.

English Language Abstract, JP Patent First Publication No. 2004-170724, Jun. 17, 2004, 1 page.

English Language Abstract, JP Patent First Publication No. 2005-292768, Oct. 20, 2005, 1 page.

English Language Abstract, JP Patent First Publication No. 2004-214581, Jul. 29, 2004, 1 page.

English Language Abstract, KR Patent First Publication No. 10-0307052, Aug. 17, 2001, 1 page.

English Language Abstract, KR Patent First Publication No. 1020010082837, Aug. 31, 2001, 1 page.

English Language Abstract, KR Patent First Publication No. 1020010096804, Nov. 8, 2001, 1 page.

English Language Abstract, KR Patent First Publication No. 1020030010023, Feb. 5, 2003, 1 page.

English Language Abstract, KR Patent First Publication No. 1020030042081, May 28, 2003, 1 page.

English Language Abstract, KR Patent First Publication No. 1020050068611, Jul. 5, 2005, 1 page.

\* cited by examiner

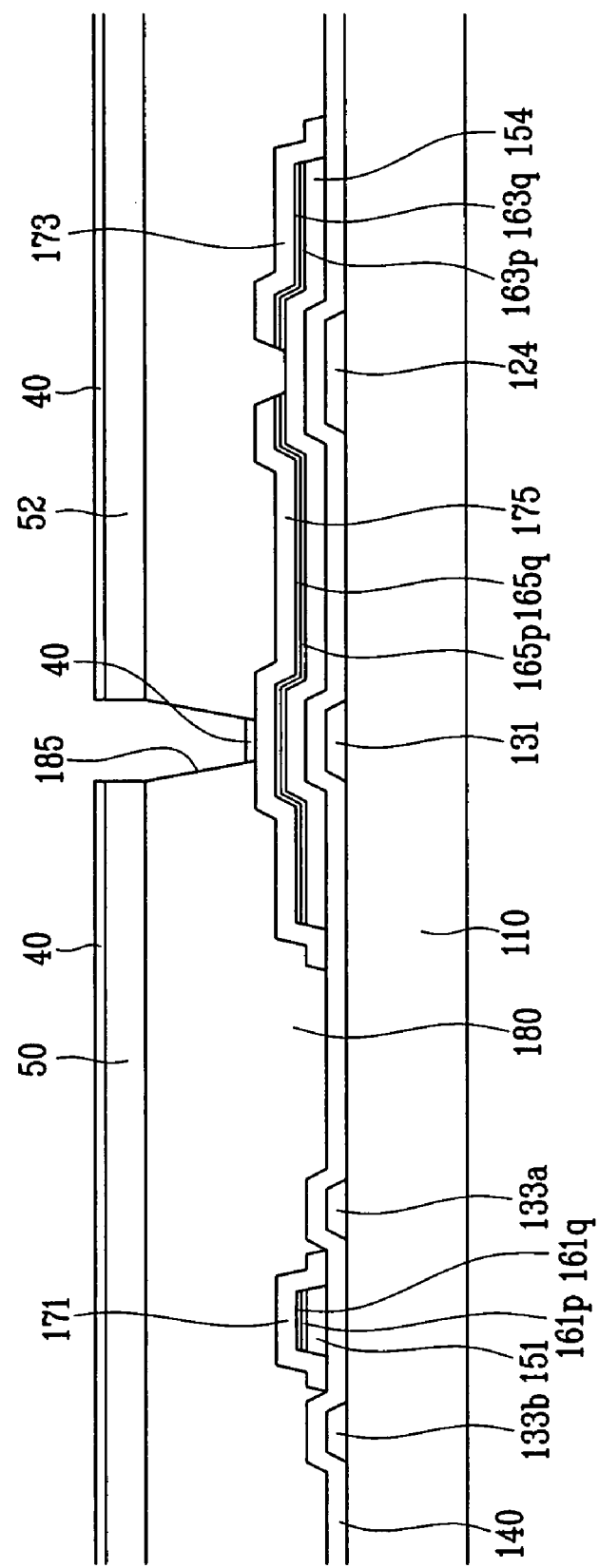

THIN FILM TRANSISTOR PANEL AND MANUFACTURING METHOD THEREOF

CROSS-REFERENCE TO RELATED APPLICATION

This application claims priority to and the benefit of Korean Patent Application No. 10-2006-0023946 filed in the Korean Intellectual Property Office on Mar. 15, 2006, the entire content of which is incorporated herein by reference.

BACKGROUND OF THE INVENTION (a) Field of the Invention

The present invention relates to a thin film transistor array panel and its manufacturing method.

(b) Description of the Related Art

Flat panel displays, such as liquid crystal displays (LCDs) and organic light emitting diode (OLED) displays, include several pairs of field generating electrodes and electro-optical active layers interposed between the field generating electrodes. The LCD includes a liquid crystal layer as an electro-optical active layer, and the OLED includes an organic emission layer as the electro-optical active layer.

One electrode of a pair of field generating electrodes, i.e., a pixel electrode, is commonly connected to a switching element for transmitting electrical signals to the pixel electrode, and the electro-optical active layer converts the electrical signals to optical signals to display an image.

A thin film transistor (TFT) having three terminals is used for the switching element in the flat panel display, and a plurality of signal lines such as gate lines and data lines are also provided on the flat panel display. The gate lines transmit signals for controlling the TFTs and the data lines transmit signals that are applied to the pixel electrodes.

The lengths of the gate and data lines increase with the LCD size. As the line lengths increase, resistance on the lines increase and cause a signal delay or a voltage drop. Wiring made of a material having low resistivity, such as aluminum or copper, is desired to overcome these problems caused by increased resistance on the lines.

However, aluminum lines have their disadvantages. When a signal line made of aluminum directly contacts a semiconductor layer of a thin film transistor, aluminum atoms diffuse into the semiconductor layer and lower the performance of the thin film transistor. Also, a signal line made of aluminum has a poor contact property with other materials such as indium-tin-oxide (ITO), and thus a pixel electrode of ITO in direct contact with the aluminum signal line may receive imperfect signals from the aluminum signal line.

SUMMARY OF THE INVENTION

The present invention prevents aluminum in the signal lines from diffusing into a semiconductor layer of a TFT and layers formed on aluminum signal lines from becoming loose.

In one aspect, the invention is a TFT array panel that includes a substrate; a gate line including a gate electrode formed on the substrate and having a single-layered structure; a gate insulating layer formed on the gate line; a semiconductor layer formed on the gate insulating layer; a barrier layer formed on the semiconductor layer and including nitrogen; a data line including a source electrode formed on the barrier layer and having a single-layered structure; a drain electrode formed on the barrier layer, spaced apart from the source electrode, and having a single-layered structure; and a pixel electrode electrically connected to the drain electrode.

The gate line and the data line may include the same materials.

The gate line and the data line may include aluminum or an aluminum alloy. The gate line and the data line may include copper or a copper alloy.

The TFT array panel may further include a passivation layer formed between the data line and the pixel electrode and having a first contact hole exposing the drain electrode and a first buffer member interposed between the drain electrode and the pixel electrode and disposed in the first contact hole, and the pixel electrode may be electrically connected to the drain electrode through the first buffer member.

The first buffer member may include molybdenum or a molybdenum alloy.

The passivation layer and the gate insulating layer may have a second contact hole exposing a portion of the gate line, the passivation layer may have a third contact hole extending to a predetermined portion of the data line, and the TFT array panel may further include a second buffer member disposed on the predetermined portion of the gate line and in the second contact hole and a third buffer member disposed on the predetermined portion of the data line and in the third contact hole.

The TFT array panel may include a first contact assistant formed on the second buffer member and a second contact assistant formed on the third buffer member.

The second and third buffer members may include molybdenum or a molybdenum alloy.

In another aspect, the invention is a manufacturing method of a TFT array panel that may include forming a gate line having a single-layered structure on a substrate; forming a gate insulating layer on the gate line; forming a semiconductor layer on the gate insulating layer; forming a barrier layer including nitrogen on the semiconductor layer; forming a data line including a source electrode, and a drain electrode on the barrier layer, the data line and the drain electrode having a single-layered structure; forming a passivation layer having a plurality of contact holes extending to a predetermined portion of the data line and the drain electrode; and forming a pixel electrode electrically connected to the drain electrode on the passivation layer.

The gate line and the data line may be made of the same material.

The gate line and the data line may include aluminum or an aluminum alloy. The gate line and the data line may include copper or a copper alloy.

The method may further include forming a first buffer member disposed on the predetermined portion of the data line and in the first contact hole and a second buffer member disposed between the drain electrode and the pixel electrode and in the second contact hole.

The formation of the passivation layer and the formation of the first and the second buffer members may include depositing the passivation layer; forming a photoresist film on the passivation layer; etching the passivation layer using the photoresist film as an etch mask to form the first and the second contact holes; depositing a conductive layer on the photoresist film and in the contact holes; and removing the photoresist film with portions of the conductive layer disposed on the photoresist film to leave the first and the second buffer members in the first and the second contact holes.

The buffer member may include molybdenum or a molybdenum alloy.

A thin film transistor array panel according to another embodiment of the invention may include: a substrate; a gate electrode disposed on the substrate and having a single-layered structure; a gate insulating layer disposed on the gate electrode; an intrinsic semiconductor layer disposed on the gate insulating layer; a source electrode disposed on the intrinsic semiconductor layer and having a single-layered structure; a drain electrode disposed on the intrinsic semiconductor layer, spaced apart from the source electrode, and having a single-layered structure; and a first extrinsic semiconductor member interposed between the intrinsic semiconductor layer and the source electrode and comprising nitrogen; a second extrinsic semiconductor member interposed between the intrinsic semiconductor layer and the drain electrode and comprising nitrogen; and a pixel electrode electrically connected to the drain electrode.

BRIEF DESCRIPTION OF THE DRAWINGS

FIG. 16a to FIG. 16e are sectional views sequentially showing a manufacturing method of the TFT array panel shown in FIG. 13 to FIG. 15;

DETAILED DESCRIPTION OF THE EMBODIMENTS

The present invention will be described more fully hereinafter with reference to the accompanying drawings, in which preferred embodiments of the invention are shown. As those skilled in the art would understand, the described embodiments may be modified in various ways without departing from the spirit or scope of the present invention.

First, a thin film transistor (TFT) array panel according to an embodiment of the present invention will be described in detail with reference to FIGS. 1, 2, and 3.

Figure 1:
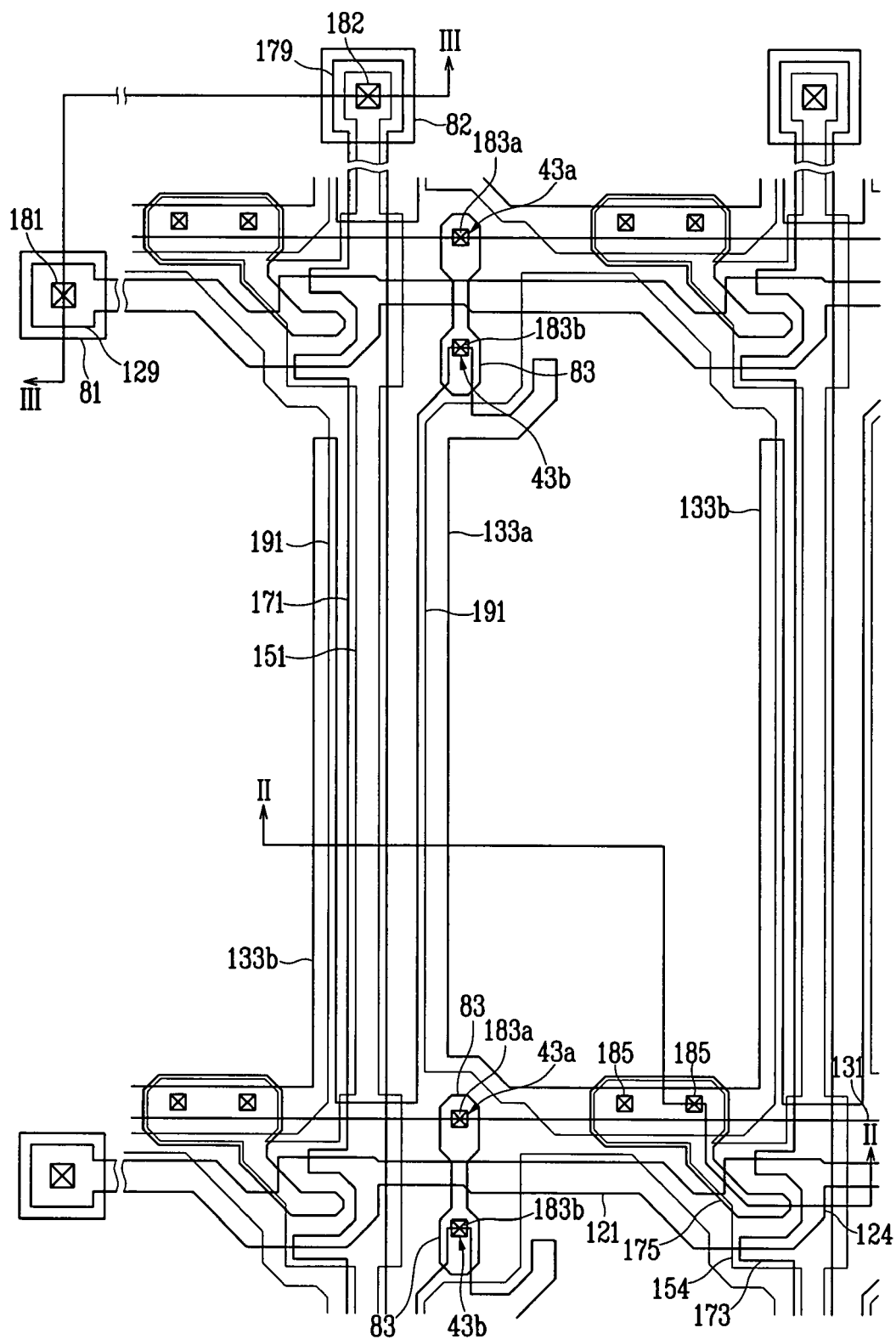
FIG. 1 shows a layout of a TFT array panel according to an embodiment of the present invention.
Figure 2:
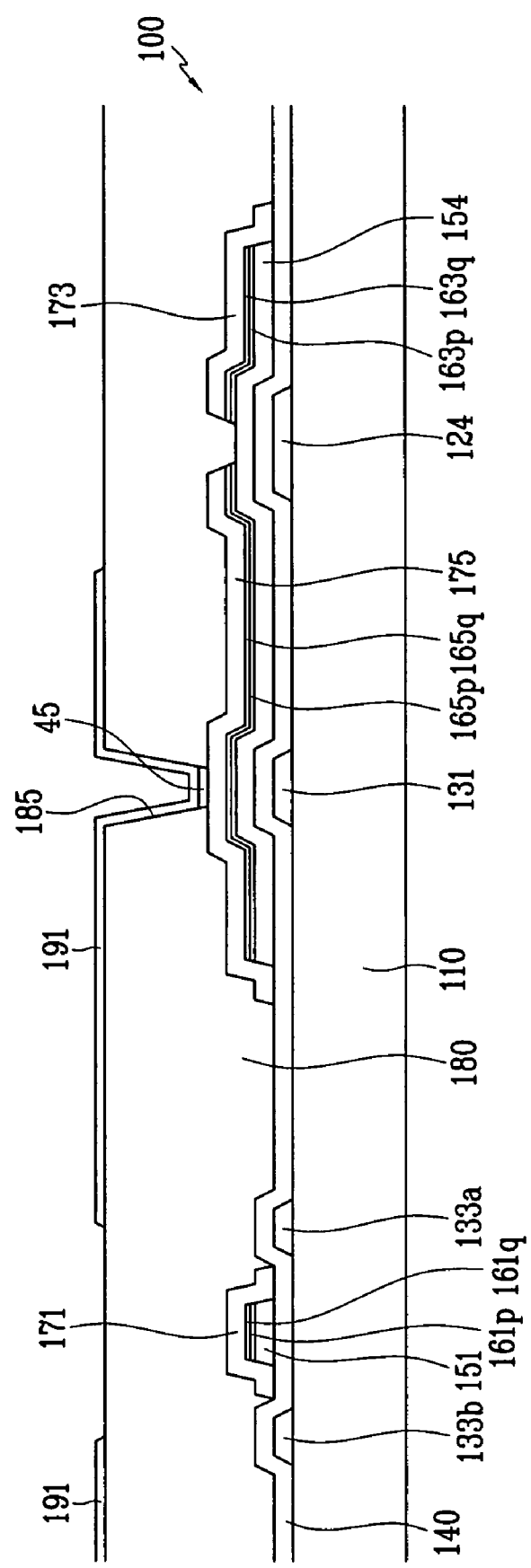
FIG. 2 and FIG. 3 are sectional views of the TFT array panel shown in FIG. 1 taken along the lines II-II and III-III, respectively.
Figure 3:
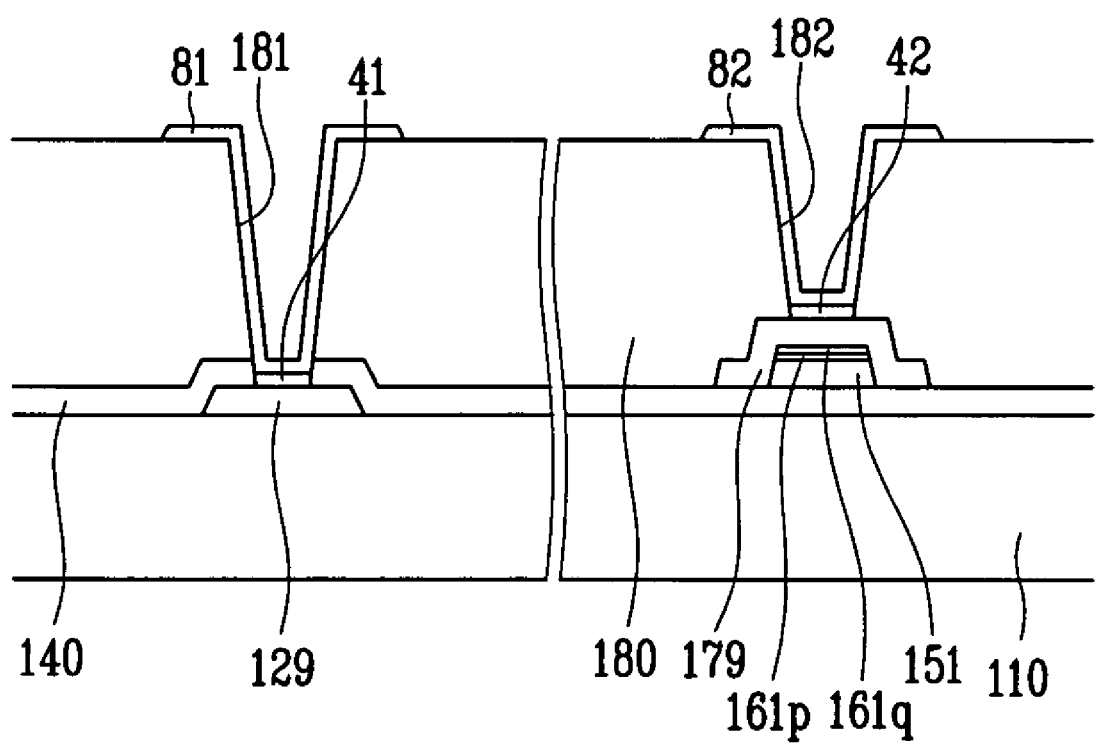

FIG. 1 is a layout view of a TFT array panel according to an embodiment of the present invention, and FIG. 2 and FIG. 3 are sectional views of the TFT array panel shown in FIG. 1 taken along the lines II-II and III-III, respectively.

A plurality of gate lines 121 and a plurality of storage electrode lines 131 are formed on an insulating substrate 110 such as transparent glass or plastic.

The gate lines 121 transmit gate signals and extend substantially in a transverse direction. Each of the gate lines 121 includes a plurality of gate electrodes 124 projecting from the main line of the gate lines 121 and an end portion 129 having a large area for contact with another layer or an external driving circuit. A gate driving circuit (not shown) for generating the gate signals may be mounted on a flexible printed circuit (FPC) film (not shown), which may be attached to the substrate 110, directly mounted on the substrate 110, or integrated onto the substrate 110. The gate lines 121 may extend to be connected to a driving circuit that may be integrated on the substrate 110.

The storage electrode lines 131 are supplied with a predetermined voltage, and each of the storage electrode lines 131 includes a stem extending substantially parallel to the gate lines 121 and a plurality of pairs of first and second storage electrodes 133a and 133b branching from the stem. Each of the storage electrode lines 131 is disposed between two adjacent gate lines 121, and the stem is close to one of the two adjacent gate lines 121. Each of the storage electrodes 133a and 133b has a fixed end portion connected to the stem and a free end portion. The fixed end portion of the first storage electrode 133a has a large area and the free end portion is bifurcated into a linear branch and a curved branch. The particular shapes and arrangements of the lines are just exemplary, and, the storage electrode lines 131 may have various shapes and arrangements not explicitly described herein.

The gate lines 121 and storage electrode lines 131 may be made of an Al-containing metal such as Al and an Al alloy having low resistivity. However, this is not a limitation of the invention and the gate lines 121 and the storage electrode lines 131 may be made of other metals or conductors.

The lateral sides of the gate lines 121 and the storage electrode lines 131 are inclined relative to a surface of the substrate 110 to form an inclination angle of about 30 to 80 degrees with respect to the substrate 110.

A gate insulating layer 140 preferably made of silicon nitride (SiNx) or silicon oxide (SiOx) is formed on the gate lines 121 and the storage electrode lines 131.

A plurality of semiconductor stripes 151 preferably made of hydrogenated amorphous silicon (abbreviated to "a-Si") or polysilicon are formed on the gate insulating layer 140. Each of the semiconductor stripes 151 extends substantially in a first direction and includes a plurality of projections 154 branching out toward the gate electrodes 124. The semiconductor stripes 151 become wide near the gate lines 121 and the storage electrode lines 131 such that the semiconductor stripes 151 cover large areas of the gate lines 121 and the storage electrode lines 131.

A plurality of ohmic contact stripes and islands 161 and 165 are formed on the semiconductor stripes 151. Each of the ohmic contact stripes 161 includes a plurality of projections 163, and the projections 163 and the ohmic contact islands 165 are located in pairs on the projections 154 of the semiconductor stripes 151. The ohmic contacts 161 and 165 are thinner than the semiconductor stripes 151, and each of the ohmic contacts 161 and 165 includes a lower film 161p and 165p and an upper film 161q and 165q. In FIGS. 2 and 3, for the projections 163, the lower and upper films are denoted by additional characters p and q, respectively.

The lower film 161p and 165p may be made of n+ hydrogenated a-Si heavily doped with an n-type impurity such as phosphorus, or it may be made of silicide.

The upper film 161q and 165q may be thinner than the lower film 161p and 165q and may be made of n+ hydrogenated a-Si doped with nitrogen or a nitrogen compound. When the upper film 161q and 165q are made of n+ hydrogenated a-Si doped with nitrogen, the lower film 161p and 165p may be omitted.

The lateral sides of the semiconductor stripes 151 and the ohmic contact 161 and 165 are inclined relative to the surface of the substrate 110 to form inclination angles that are preferably in a range of about 30 to 80 degrees with respect to the substrate 110.

A plurality of data lines 171 and a plurality of drain electrodes 175 are formed on the ohmic contacts 161 and 165 and the gate insulating layer 140.

The data lines 171 transmit data signals and extend substantially in the first direction to intersect the gate lines 121. Each of the data lines 171 also intersects the storage electrode lines 131 and runs between adjacent pairs of storage electrodes 133a and 133b. Each data line 171 includes a plurality of source electrodes 173 projecting toward the gate electrodes 124, and an end portion 179 having a large area for contact with another layer or an external driving circuit. A data driving circuit (not shown) for generating the data signals may be mounted on a FPC film (not shown), which may be attached to the substrate 110, directly mounted on the substrate 110, or integrated onto the substrate 110. The data lines 171 may extend to be connected to a driving circuit that may be integrated on the substrate 110.

The drain electrodes 175 are separated from the data lines 171, and are disposed opposite the source electrodes 173 with respect to the gate electrodes 124. Each of the drain electrodes 175 includes a wide end portion and a narrow end portion. The wide end portion overlaps a storage electrode line 131 and the narrow end portion is partly enclosed by a source electrode 173.

A gate electrode 124, a source electrode 173, and a drain electrode 175 along with a projection 154 of a semiconductor stripe 151 form a TFT having a channel formed in the projection 154 disposed between the source electrode 173 and the drain electrode 175.

The data line 171 and the drain electrode 175 may be made of an Al-containing metal such as Al and an Al alloy having low resistivity. However, the data lines 171 and the drain electrodes 175 may be made of various metals or conductors.

The data lines 171 and the drain electrodes 175 have inclined edge profiles such that they form inclination angles of about 30 to 80 degrees with the substrate 110.

The ohmic contacts 161 and 165 are interposed only between the underlying semiconductor stripes 151 and the overlying conductors 171 and 175, and improve the contact characteristics between the neighboring layers. In particular, the impurity ions in the lower films 161p and 165p and the upper films 161q and 165q of the ohmic contacts 161 and 165, when they are made of n+ hydrogenated a-Si without or with nitrogen, may contribute to lowering energy barrier between the semiconductor stripes 151 and the conductors 171 and 175, and the nitrogen ingredients in the upper films 161q and 165q may contribute to blocking the diffusion of Al atoms of the conductors 171 and 175 into the semiconductor stripes 151. Thus, in one sense, the upper films 161q and 165q may be regarded as a diffusion barrier layer.

Although the semiconductor stripes 151 are narrower than the data lines 171 at most places, the width of the semiconductor stripes 151 becomes large near the gate lines 121 and the storage electrode lines 131 as described above. This way, the profile of the surface is smoothed and disconnection of the data lines 171 is prevented. The semiconductor stripes 151 include some exposed portions. "Exposed portions" of the semiconductor stripes 151 refer to portions that are not covered with the data lines 171 or the drain electrodes 175, such as the portions located between the source electrodes 173 and the drain electrodes 175.

A passivation layer 180 is formed on the data lines 171, the drain electrodes 175, and the exposed portions of the semiconductor stripes 151. The passivation layer 180 may be made of an inorganic or organic insulator and it may have a substantially flat top surface. Examples of the inorganic insulator include silicon nitride and silicon oxide. The organic insulator may have photosensitivity and dielectric constant less than about 4.0. The passivation layer 180 may include a lower film of an inorganic insulator and an upper film of an organic insulator such that it takes the excellent insulating characteristics of the organic insulator while preventing the exposed portions of the semiconductor stripes 151 from being damaged by the organic insulator.

The passivation layer 180 has a plurality of contact holes 182 and 185 exposing the end portions 179 of the data lines 171 and the drain electrodes 175, respectively. The passivation layer 180 and gate insulating layer 140 have a plurality of contact holes 181 exposing the end portions 129 of the gate lines 121, a plurality of contact holes 183a exposing portions of the storage electrode lines 131 near the fixed end portions of the first storage electrodes 133a, and a plurality of contact holes 183b exposing the linear branches of the free end portions of the first storage electrodes 133a.

A plurality of buffer members 41, 42, 43a, 43b, and 45 are formed in the contact holes 181, 182, 183a, 183b, and 185. The buffer members 41, 42, 43a, 43b, and 45 have substantially the same planar shape as the contact holes 181, 182, 183a, 183b, and 185 and may be made of a refractory metal such as a Mo-containing metal, etc. The buffer members 41, 42, 43a, 43b, and 45 fully cover the portions of the end portions 129 and 179, the storage electrode lines 131, ad the drain electrodes 175, which are exposed through the contact holes 181, 182, 183a, 183b, and 185.

A plurality of pixel electrodes 191, a plurality of overpasses 83, and a plurality of contact assistants 81 and 82 are formed on the passivation layer 180 and the buffer members 41, 42, 43a, 43b, and 45. They are preferably made of a transparent conductor such as ITO or IZO. However, they may be made of a reflective conductor such as Al, Ag, Cr, or alloys thereof, depending on the embodiment.

The pixel electrodes 191 contact the buffer members 45 and are electrically connected to the drain electrodes 175 through the buffer members 45 such that the pixel electrodes 191 receive data voltages from the drain electrodes 175. The pixel electrodes 191 supplied with the data voltages generate electric fields in cooperation with a common electrode (not shown) of an opposing display panel (not shown) supplied with a common voltage, which determine the orientations of liquid crystal molecules (not shown) of a liquid crystal layer (not shown) disposed between the two electrodes. A pixel electrode 191 and the common electrode form a capacitor referred to as a "liquid crystal capacitor," which stores applied voltages after the TFT is turned off.

The pixel electrode 191 and the drain electrode 175 connected thereto overlap a storage electrode line 131 including storage electrodes 133a and 133b. The pixel electrode 191, a drain electrode 175 connected thereto, and the storage electrode line 131 form an additional capacitor referred to as a "storage capacitor," which enhances the voltage storing capacity of the liquid crystal capacitor.

The contact assistants 81 and 82 contact the buffer members 41 and 42 and are respectively in electrical connection with the end portions 129 of the gate lines 121 and the end portions 179 of the data lines 171 through the buffer members 41 and 42. The contact assistants 81 and 82 protect the end portions 129 and 179 and the buffer members 41 and 42, and enhance the adhesion between external devices and the end portions 129 and 179 or the buffer members 41 and 42.

The overpasses 83 cross over the gate lines 121 and contact the buffer members 43a and 43b. The overpasses 83 are electrically connected to the exposed portions of the storage electrode lines 131 and the exposed linear branches of the free end portions of the storage electrodes 133b through a pair of the buffer members 43a and 43b, respectively, which are disposed opposite each other with respect to the gate lines 121. The storage electrode lines 131 including the storage electrodes 133a and 133b along with the overpasses 83 can be used for repairing defects in the gate lines 121, the data lines 171, or the TFTs.

The buffer members 41, 42, 43a, 43b, and 45 improve and enhance the contact characteristic between the Al portion of the end portions 129 and 179, the storage electrode lines 131, and the drain electrodes 175, and ITO or IZO, of the contact assistants 81 and 82, the overpasses 83, and the pixel electrodes 191.

Now, a method of manufacturing the TFT array panel shown in FIGS. 1-3 according to an embodiment of the present invention will be described in detail with reference to FIGS. 4-16E as well as FIGS. 1-3.

Figure 9:
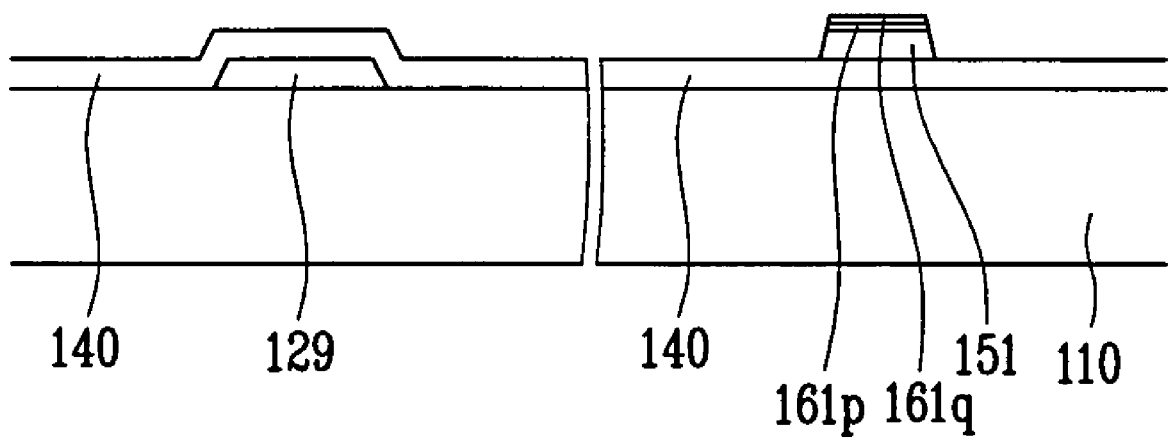
Figure 10:
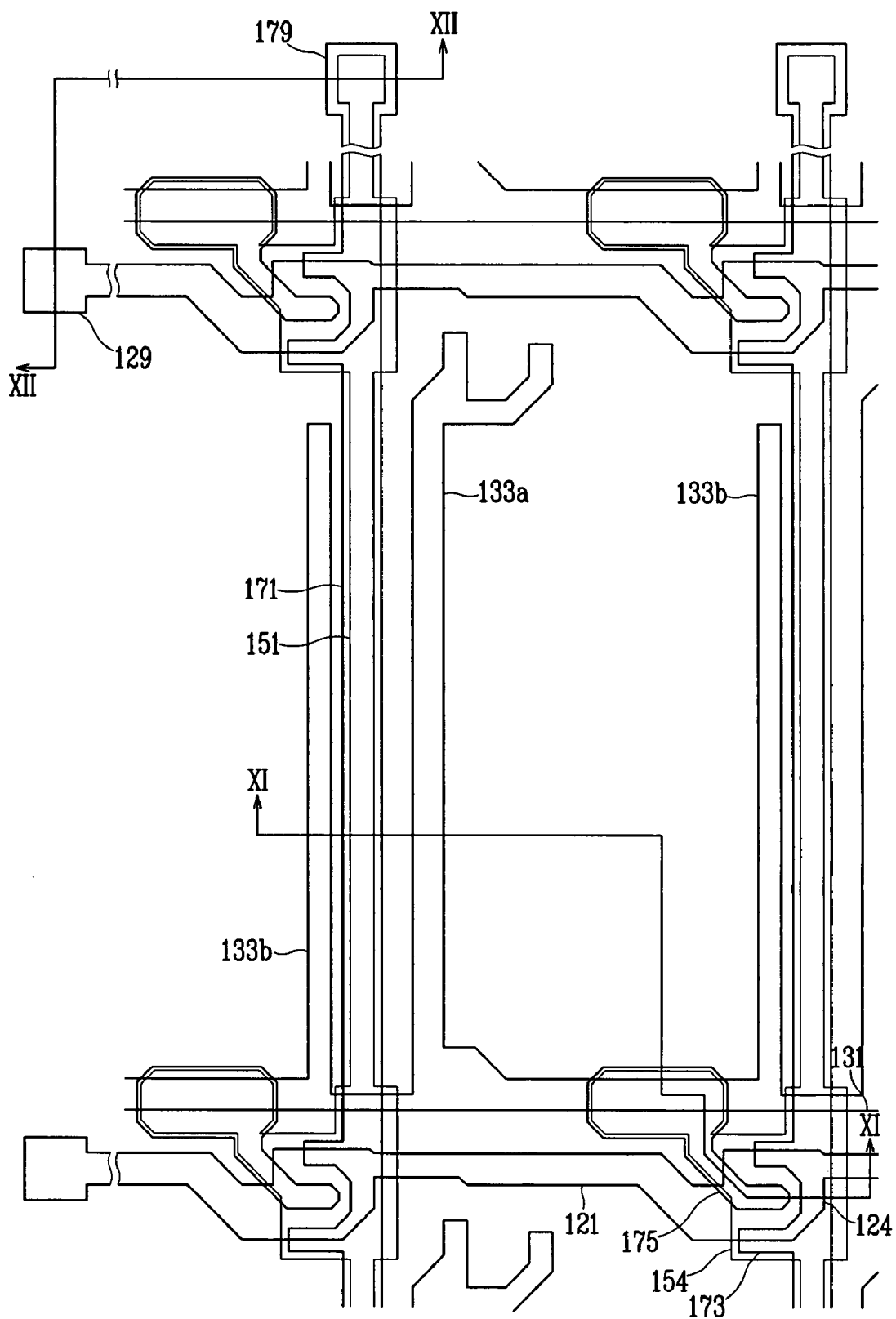
Figure 11:
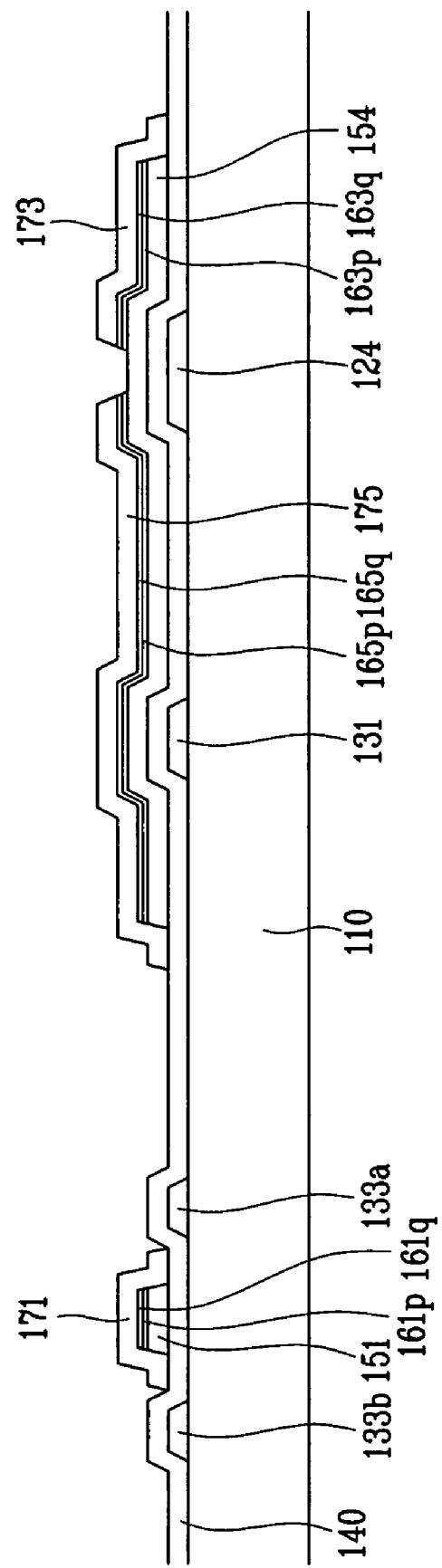
FIG. 11 and FIG. 12 are sectional views of the TFT array panel shown in FIG. 10 taken along the lines XI-XI and XII-XII, respectively.
Figure 12:
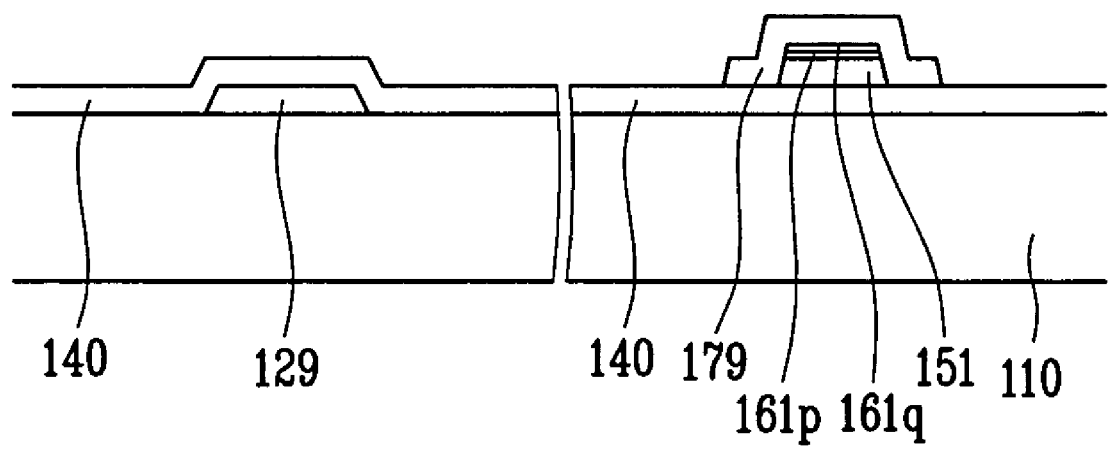

FIG. 4, FIG. 7, FIG. 10, and FIG. 13 show the layouts of the TFT array panel at intermediate stages of manufacturing according to an embodiment of the present invention; FIG. 5 and FIG. 6 are sectional views of the TFT array panel shown in FIG. 4 taken along the lines V-V and VI-VI, respectively; FIG. 8 and FIG. 9 are sectional views of the TFT array panel shown in FIG. 7 taken along the lines VIII-VIII and IX-IX, respectively; FIG. 11 and FIG. 12 are sectional views of the TFT array panel shown in FIG. 10 taken along the lines XI-XI and XII-XII respectively; FIG. 14 and FIG. 15 are sectional views of the TFT array panel shown in FIG. 13 taken along the lines XIV-XIV and XV-XV respectively; and FIG. 16a to FIG. 16e are sectional views sequentially showing process steps of forming the TFT array panel shown in FIG. 13 to FIG. 15.

Figure 4:
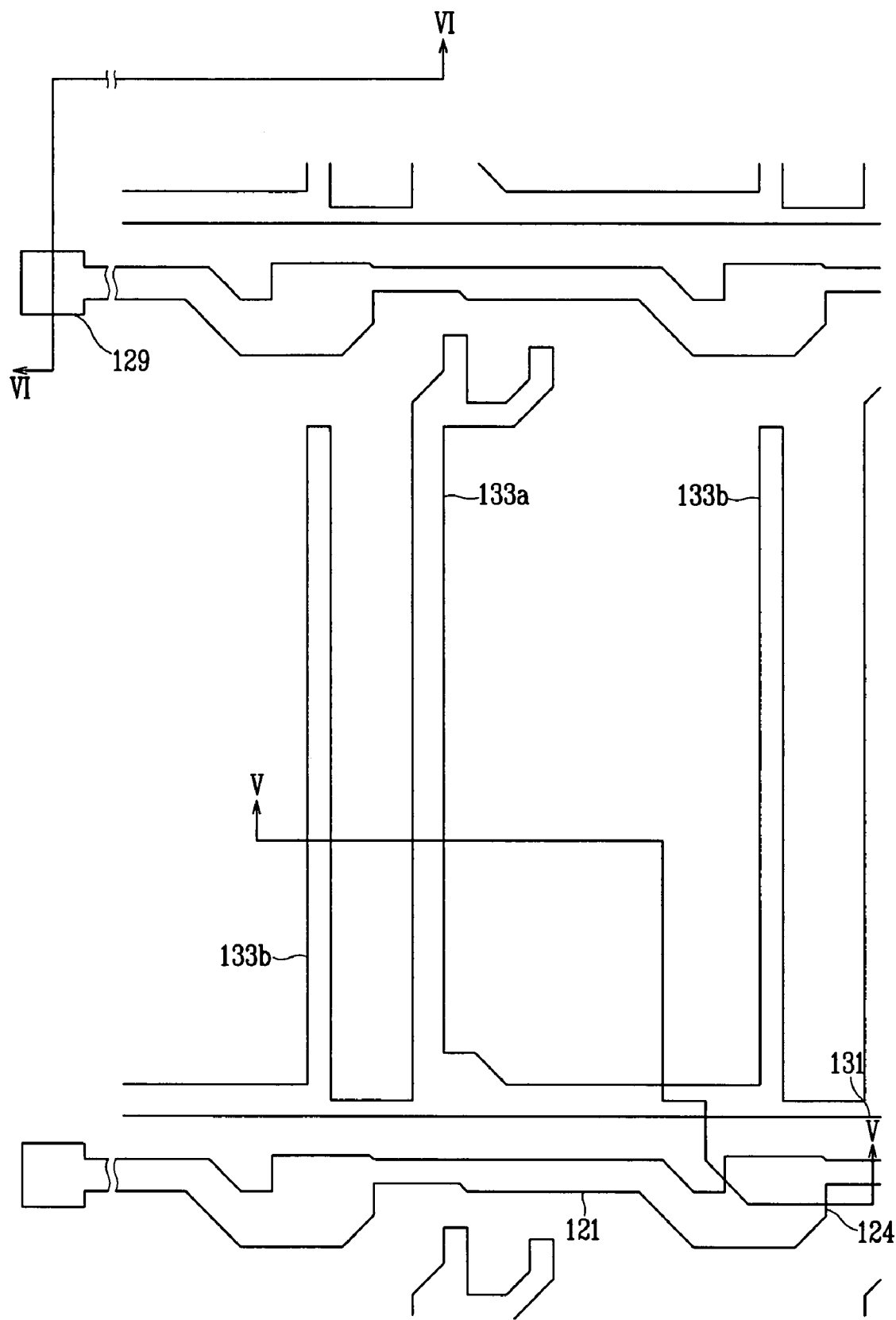
FIG. 4, FIG. 7, FIG. 10, and FIG. 13 show the layouts of the TFT array panel at intermediate stages of manufacturing according to an embodiment of the present invention.
Figure 5:
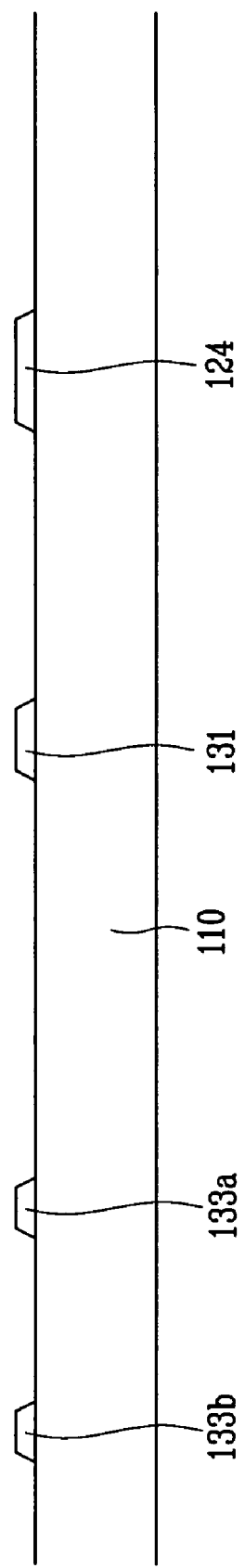
FIG. 5 and FIG. 6 are sectional views of the TFT array panel shown in FIG. 4 taken along the lines V-V and VI-VI, respectively.
Figure 6:
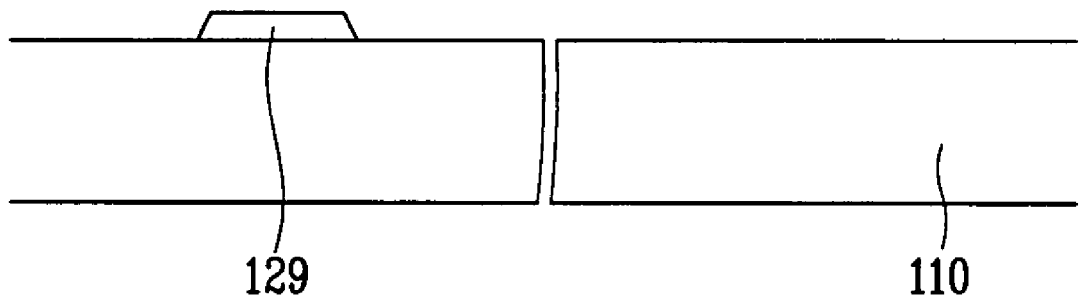

Referring to FIG. 4 to FIG. 6, a metal film containing Al or an Al-containing metal is deposited on an insulating substrate 110 by sputtering, etc., and then the metal film is patterned by photolithography and etching to form a plurality of gate lines 121 with gate electrodes 124 and end portions 129 and a plurality of storage electrode lines 131 including storage electrodes 133a and 133b.

Figure 7:
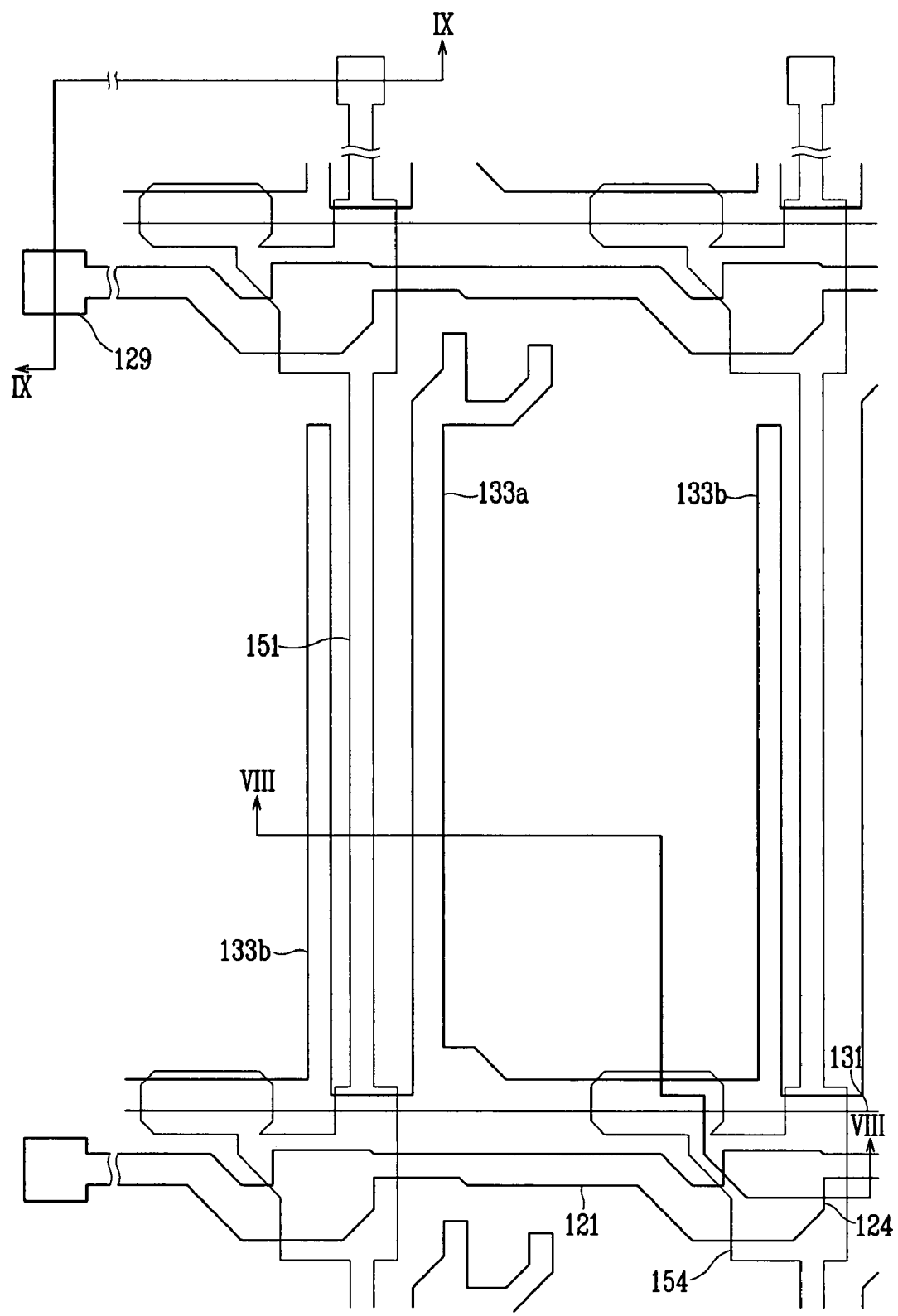
Figure 8:
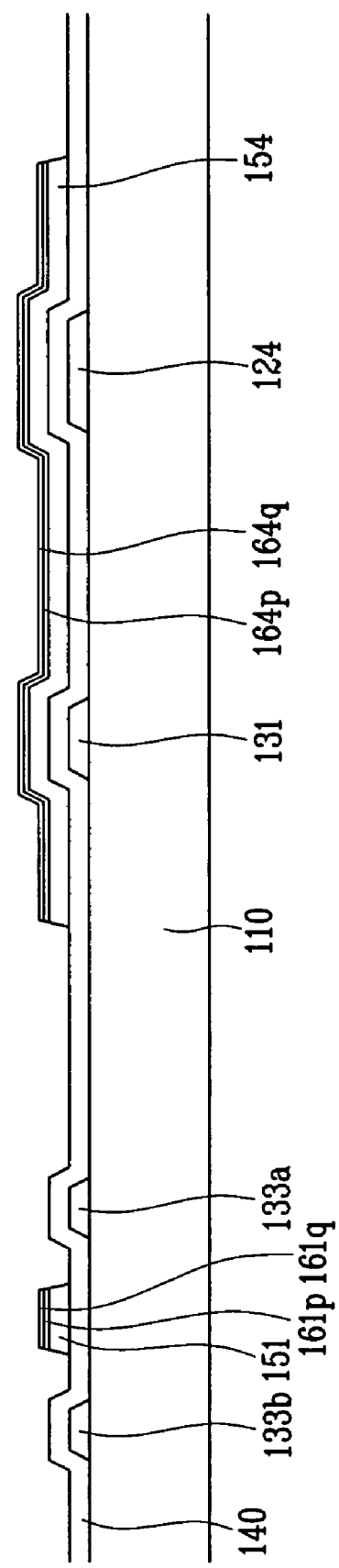
FIG. 8 and FIG. 9 are sectional views of the TFT array panel shown in FIG. 7 taken along the lines VIII-VIII and IX-IX, respectively.

As shown in FIG. 7 to FIG. 9, a gate insulating layer 140 is deposited, and then a plurality of (intrinsic) semiconductor stripes 151 including projections 154, and a plurality of extrinsic semiconductor stripes 164 are formed thereon. Each of the impurity semiconductor stripes 164 includes a lower film 164p and an upper film 164q.

The gate insulating layer 140, an intrinsic a-Si layer, and an extrinsic a-Si layer are sequentially deposited by CVD or another suitable deposition method. Next, a top surface of the extrinsic a-Si layer is subjected to plasma treatment with nitrogen gas to form a nitrogen-containing layer on the extrinsic a-Si layer. The nitrogen-containing layer may be directly deposited on the extrinsic a-Si layer by performing PECVD, etc., under additional nitrogen gas as well as a gas mixture for the extrinsic a-Si layer. According to another embodiment of the present invention, the a-Si layer may be converted into the nitrogen-containing layer at all. The nitrogen-containing layer, the extrinsic a-Si layer, and the intrinsic a-Si layer are patterned by photolithography and etching to form the upper film 164q and the lower film 164p of the extrinsic semiconductor stripes 164, and the semiconductor stripes 151. A metal film including an Al-containing metal is deposited by sputtering (or another suitable method), and the metal film is patterned by photolithography and etching to form a plurality of data lines 171 including source electrodes 173 and end portions 179 and a plurality of drain electrodes 175 as shown in FIG. 10 to FIG. 12.

Thereafter, exposed portions of the extrinsic semiconductor stripes 164, which are not covered with the data lines 171 and the drain electrodes 175, are removed to complete a plurality of ohmic contact stripes 161 including projections 163 and a plurality of ohmic contact islands 165, and to expose portions of the intrinsic semiconductor stripes 151.

Figure 13:
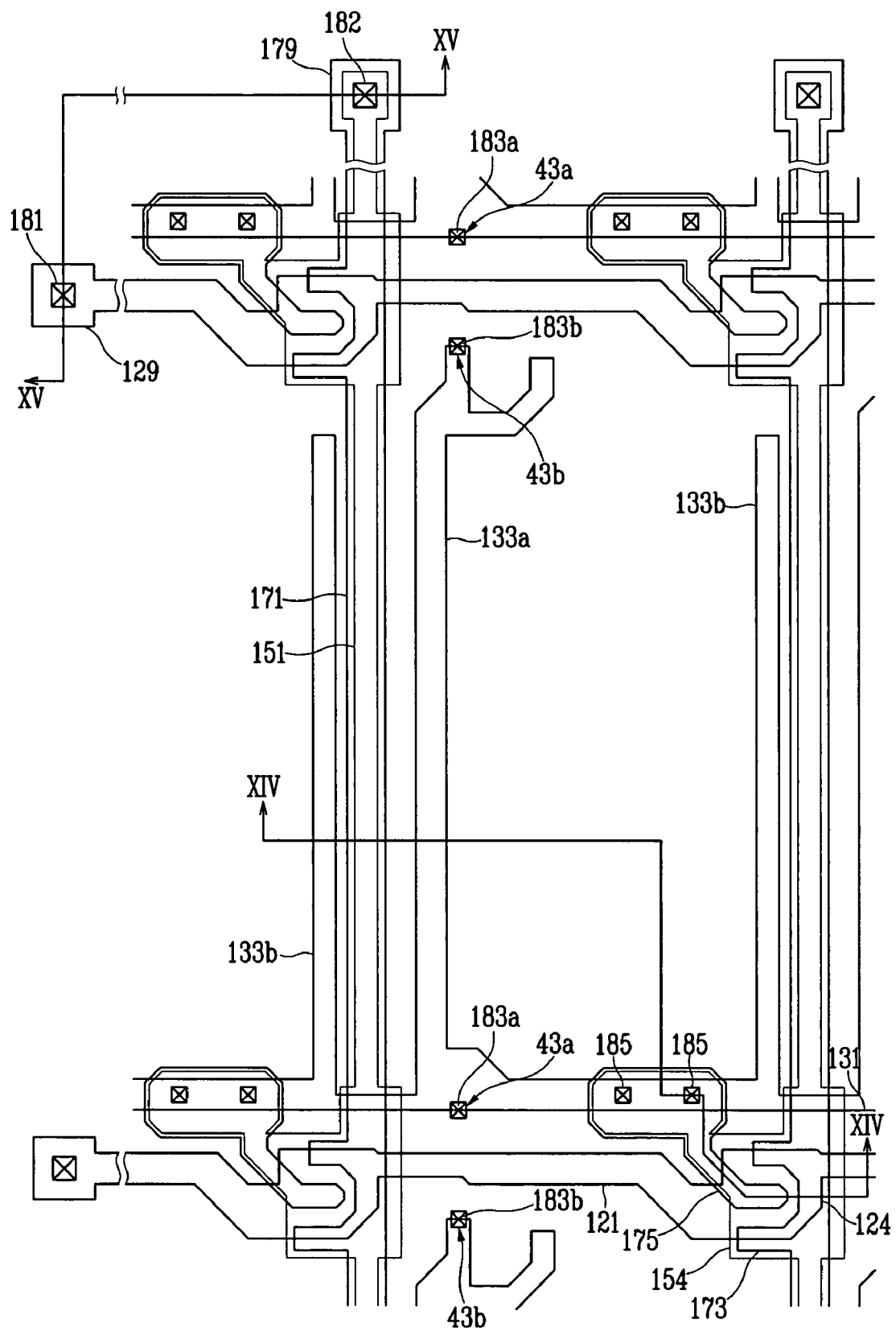
Figure 14:
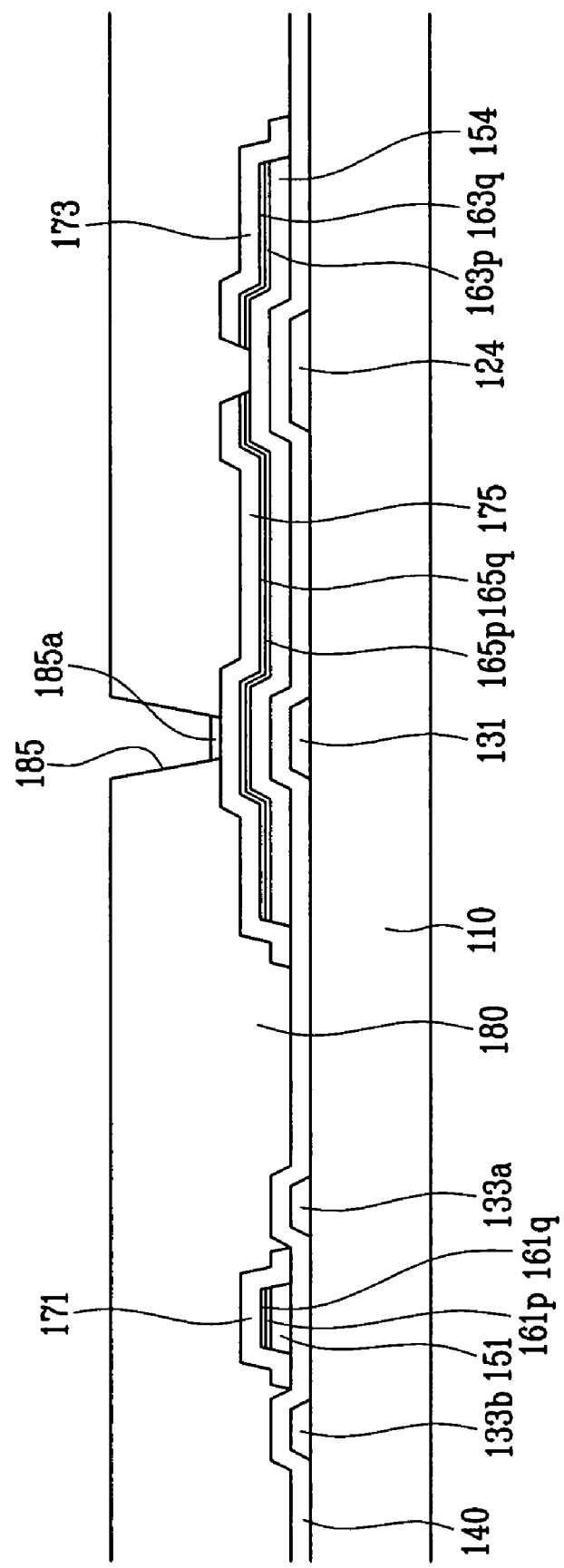
FIG. 14 and FIG. 15 are sectional views of the TFT array panel shown in FIG. 13 taken along the lines XIV-XIV and XV-XV, respectively.
Figure 15:
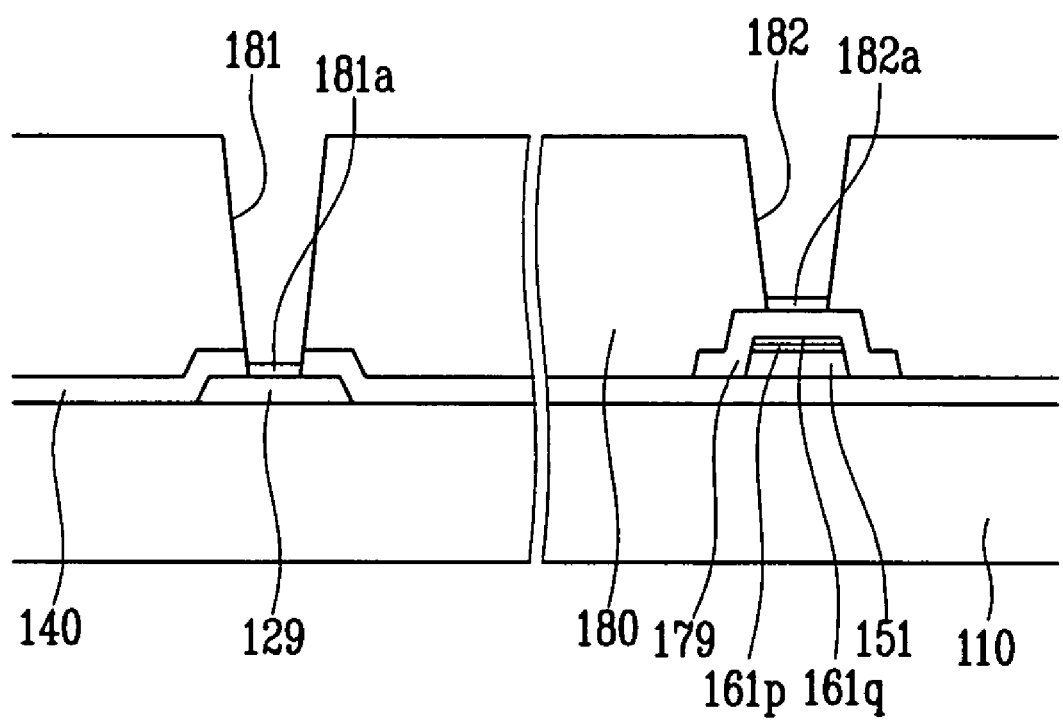

Referring to FIG. 13 to FIG. 15, a passivation layer 180 is deposited, and sequentially the passivation layer 180 and the gate insulating layer 140 are patterned by photolithography and etching to form a plurality of contact holes 181, 182, 183a, 183b, and 185. Subsequently, a plurality of buffer members 41, 42, 43a, 43b, and 45 are formed in the contact holes 181, 182, 183a, 183b, and 185.

Now, process steps for forming the contact holes 181, 182, 183a, 183b, and 185 and the buffer members 41, 42, 43a, 43b, and 45 will be described in detail with reference to FIG. 16A to FIG. 16E. Although FIGS. 16A-16E show only the sectional views corresponding to FIG. 14, the following description can cover the other structures corresponding to FIGS. 13 and 15.

Figure 16A:
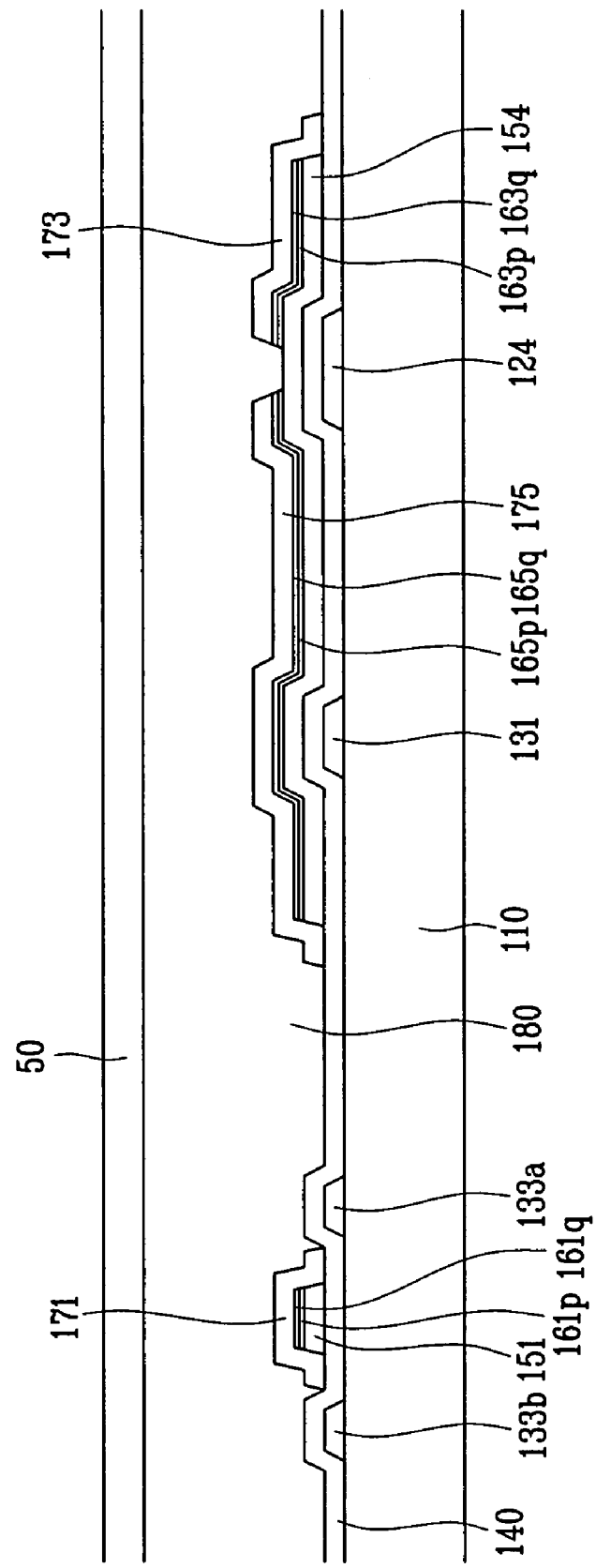
Figure 16B:
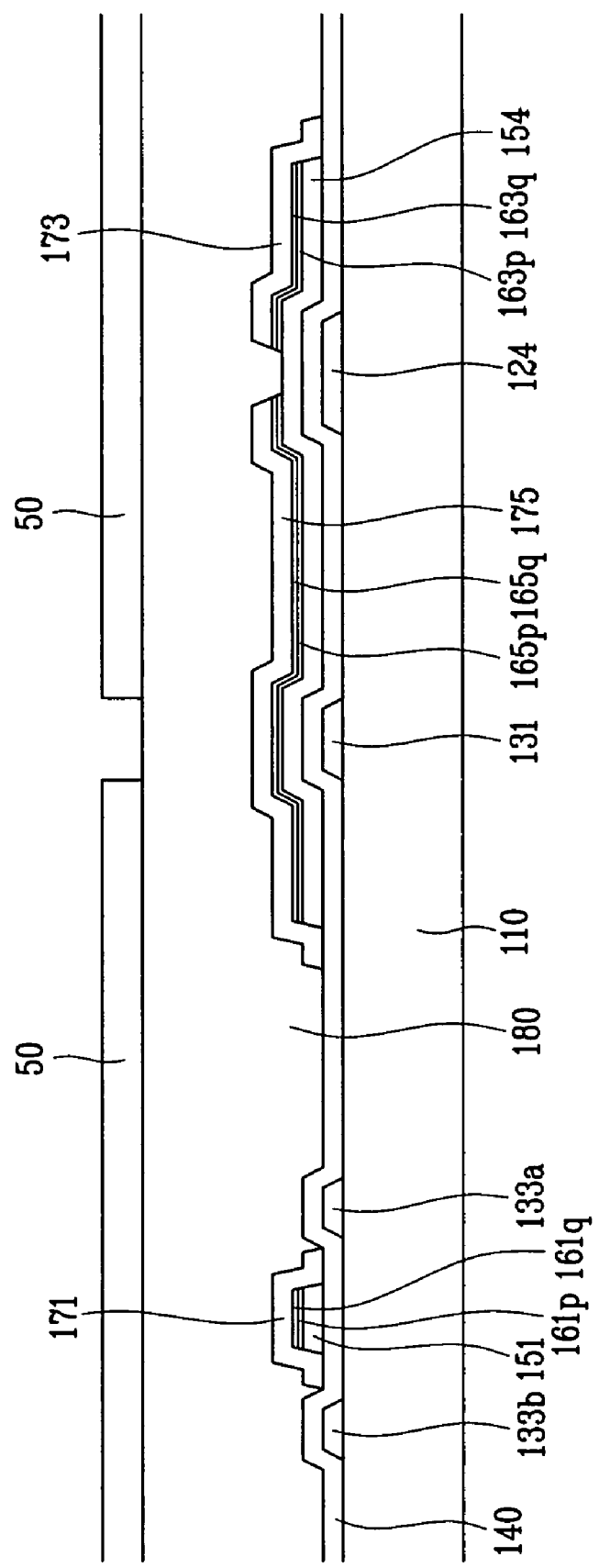

Referring to FIG. 16A, the passivation layer 180 is deposited and a photoresist film 50 is coated on the passivation layer 180. The photosensitive film 50 is subjected to light exposure and development to expose portions of the passivation layer 180 as shown in FIG. 16B.

Figure 16C:
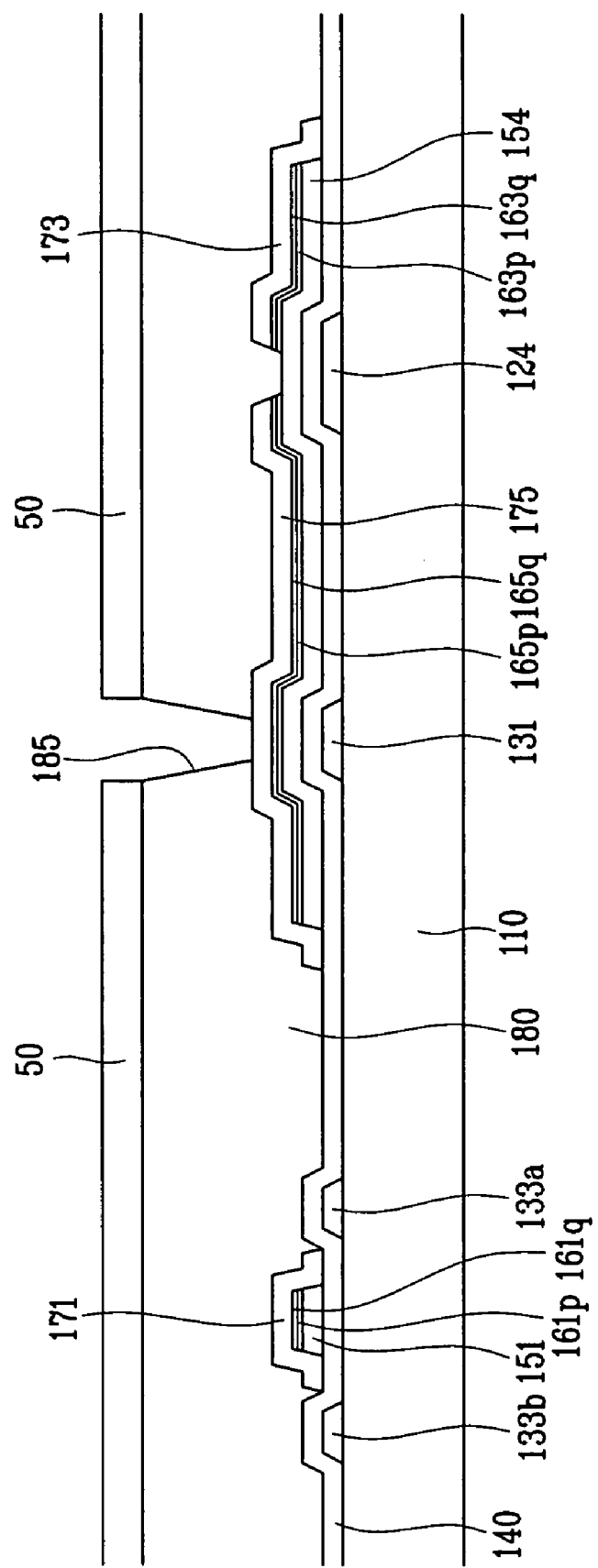

Referring to FIG. 16C, the passivation layer 180 and the gate insulating layer 140 are etched using the photoresist film 50 as an etching mask to form the contact holes 181, 182, 183a, 183b, and 185.

Figure 16E:
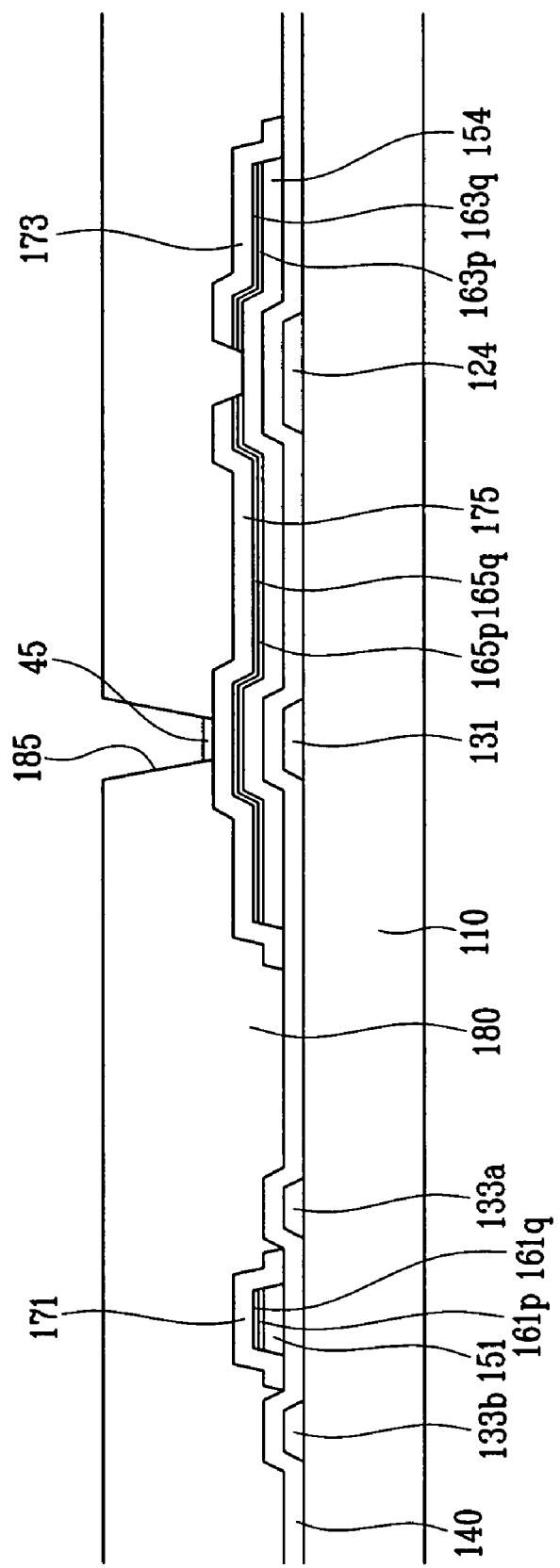

As shown in FIG. 16D, a conductor layer 40 is deposited. The conductor layer 40 can be divided into two groups: a first group disposed on the photoresist film 50 and a second group disposed in the contact holes 181, 182, 183a, 183b, and 185. Successively, the photoresist film 50 is removed, along with the first group of the conductor layer 40 disposed on the photoresist film 50. The second group of the conductor layer 40 disposed in the contact holes 181, 182, 183a, 183b, and 185 are remained to form the buffer members 41, 42, 43a, 43b, and 45, as shown in FIG. 16E. Here, the conductor layer 40 may include a refractory metal such as a Mo-containing metal, etc.

Since the buffer members 41, 42, 43a, 43b, and 45 are formed together with the contact holes 181, 182, 183a, 183b, and 185, the addition of the buffer members 41, 42, 43a, 43b, and 45 does not require an additional lithography and etching step that would increase the production cost of the TFT array panel and complicate the manufacturing process.

Finally, as shown in FIG. 1 to FIG. 3, a transparent conducting layer such as an ITO or IZO layer is deposited on the passivation layer 180 by sputtering, etc., and is patterned to form a plurality of pixel electrodes 191, a plurality of contact assistants 81 and 82, and a plurality of overpasses 83.

Next, a TFT array panel according to another embodiment of the present invention will be described in detail with reference to FIG. 17 to FIG. 19.

Figure 17:
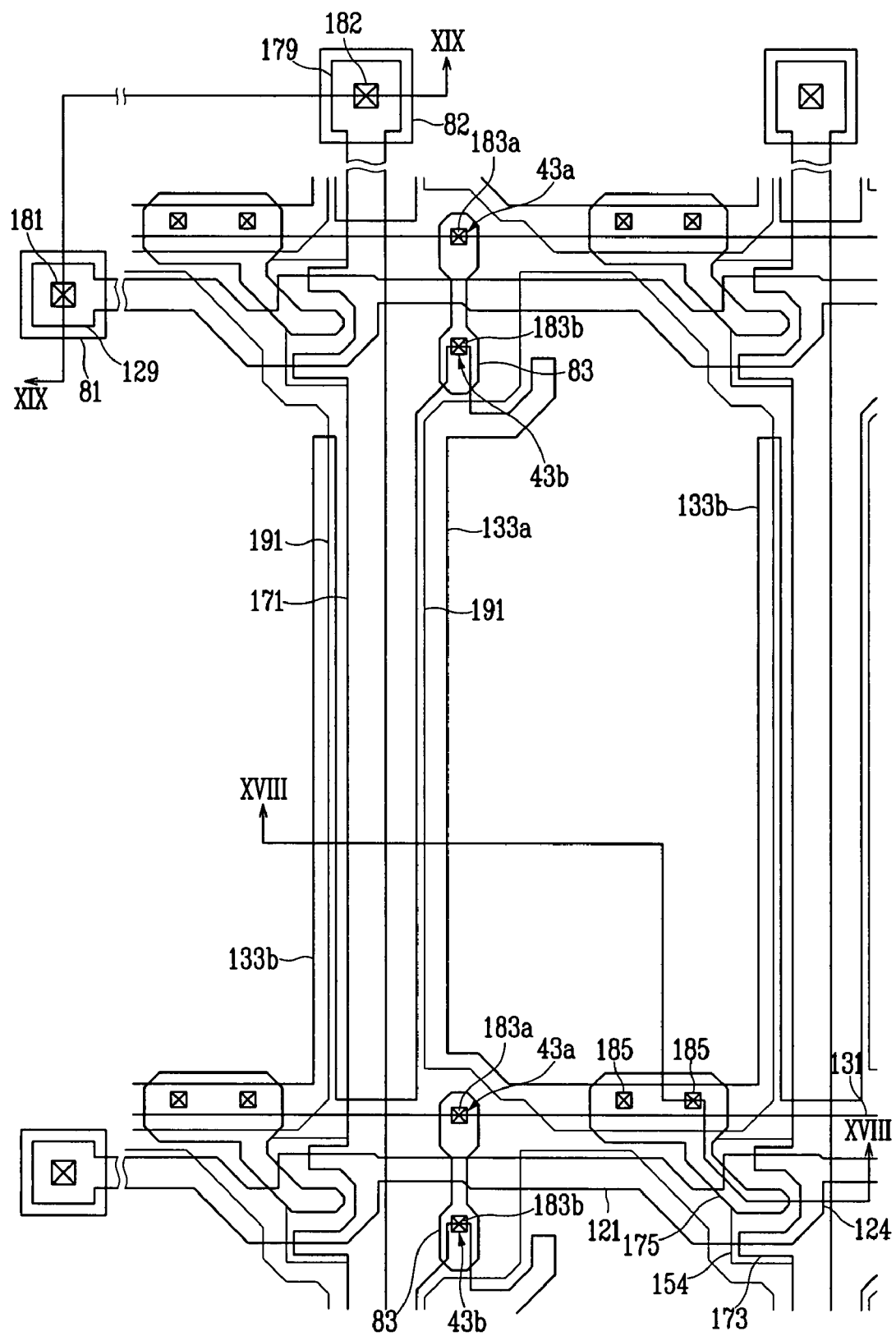
FIG. 17 shows the layout of a TFT array panel according to another embodiment of the present invention.
Figure 18:
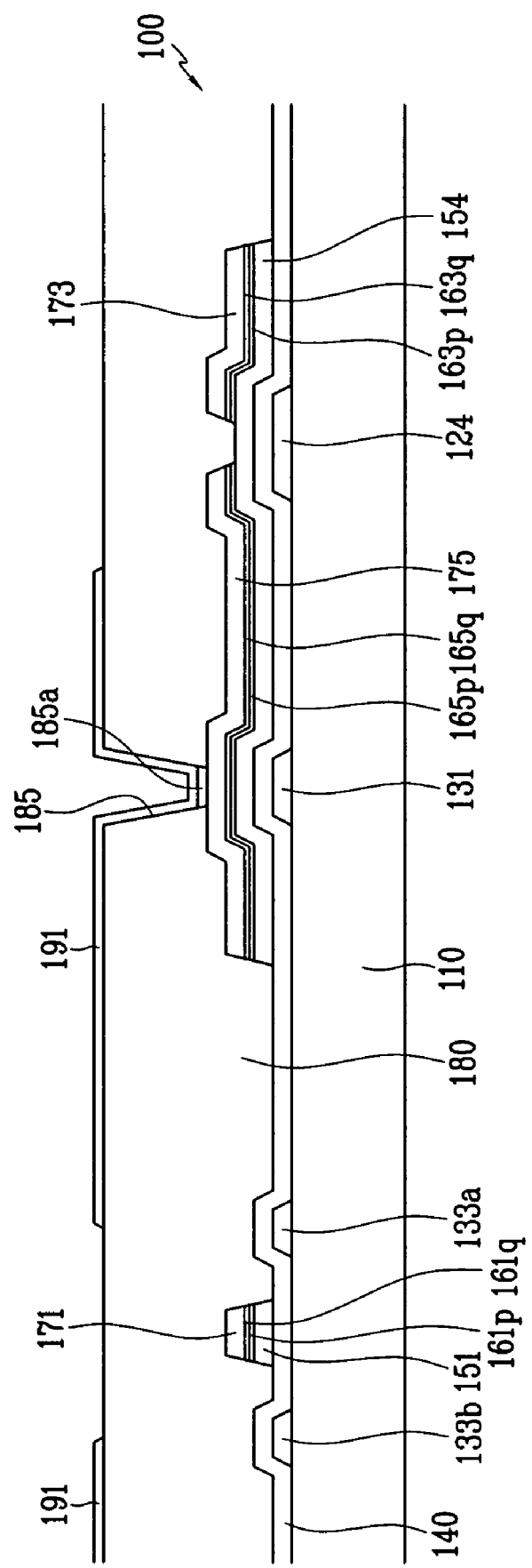
FIG. 18 and FIG. 19 are sectional views of the TFT array panel shown in FIG. 17 taken along the lines XVIII-XVIII and XIX-XIX, respectively.
Figure 19:
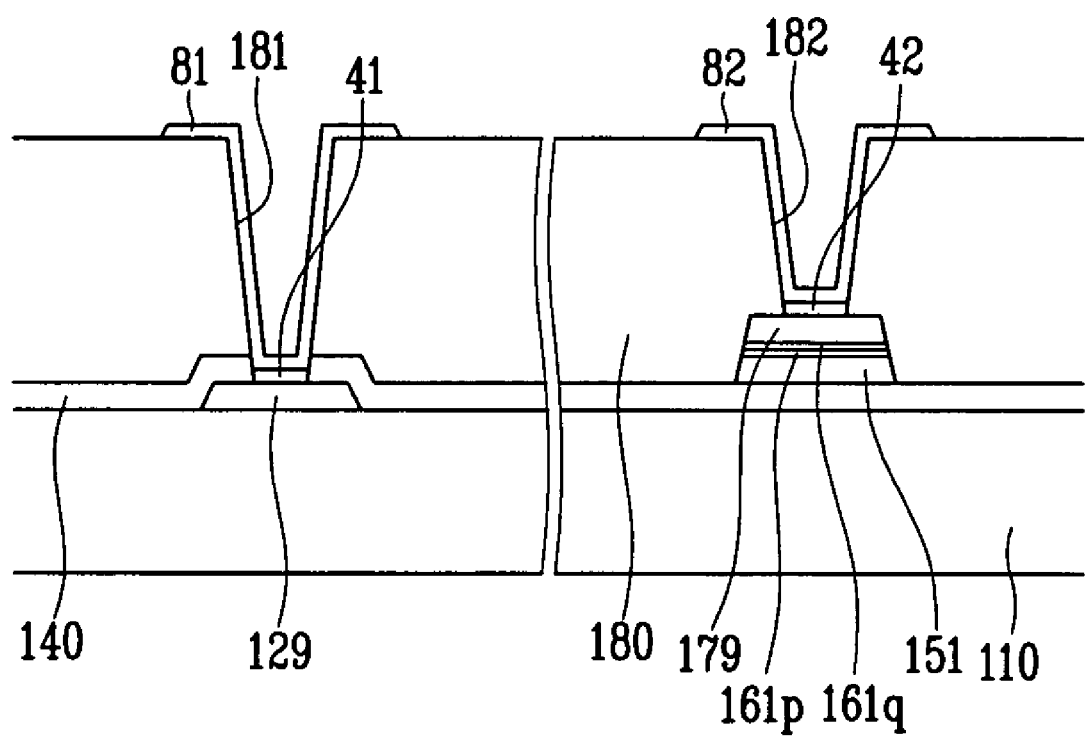

FIG. 17 shows a layout of a TFT array panel according to another embodiment of the present invention, and FIG. 18 and FIG. 19 are sectional views of the TFT array panel shown in FIG. 17 taken along the lines XVIII-XVIII and XIX-XIX, respectively.

As shown in FIG. 17 to FIG. 19, layered structures of the TFT panel according to this embodiment are almost the same as those shown in FIG. 1 to FIG. 3.

That is, a plurality of gate line 121 and a plurality of storage electrode lines 131 are formed on a substrate 110. Each of the gate line 121 includes gate electrodes 124 and an end portion 129, and each of the storage electrode lines 131 includes first and second storage electrodes 133a and 133b. A gate insulating layer 140, a plurality of semiconductor stripes 151 with projections 154, a plurality of ohmic contact stripes 161 a with projections 164a, and a plurality of ohmic contact islands 165a are sequentially formed thereon. Each of the ohmic contacts 161, 163 and 165 includes a lower film 161p, 164p and 165p and an upper film 161q, 163q and 165q.

A plurality of data lines 171 including source electrodes 173 and end portions 179 and a plurality of drain electrodes 175 are formed on the ohmic contacts 161 and 165, and a passivation layer 180 is formed thereon. The passivation layer 180 and the gate insulating layer 140 have a plurality of contact holes 181, 182, 183a, 183b, and 185, and a plurality of buffer members 41, 42, 43a, 43b, and 45 are formed in the contact holes 181, 182, 183a, 183b, and 185.

A plurality of pixel electrodes 191, a plurality of contact assistants 81 and 82, and a plurality of overpasses 83 are formed on the passivation layer 180.

However, unlike the TFT array panel shown in FIG. 1 to FIG. 3, the semiconductor stripes 151 have almost the same planar shapes as the data lines 171 and the drain electrodes 175 as well as the ohmic contacts 161 and 165.

The projections 154 of the semiconductor stripes 151 include some exposed portions, which are not covered with the data lines 171 and the drain electrodes 175, such as portions located between the source electrodes 173 and the drain electrodes 175.

Many features of the TFT array panel shown in FIGS. 1-3 are also applicable to that shown in FIGS. 17-19.

Now, a method of manufacturing the TFT array panel shown in FIG. 17 to FIG. 19 according to another embodiment of the present invention will be described in detail with reference to FIG. 20 to FIG. 28.

Figure 20:
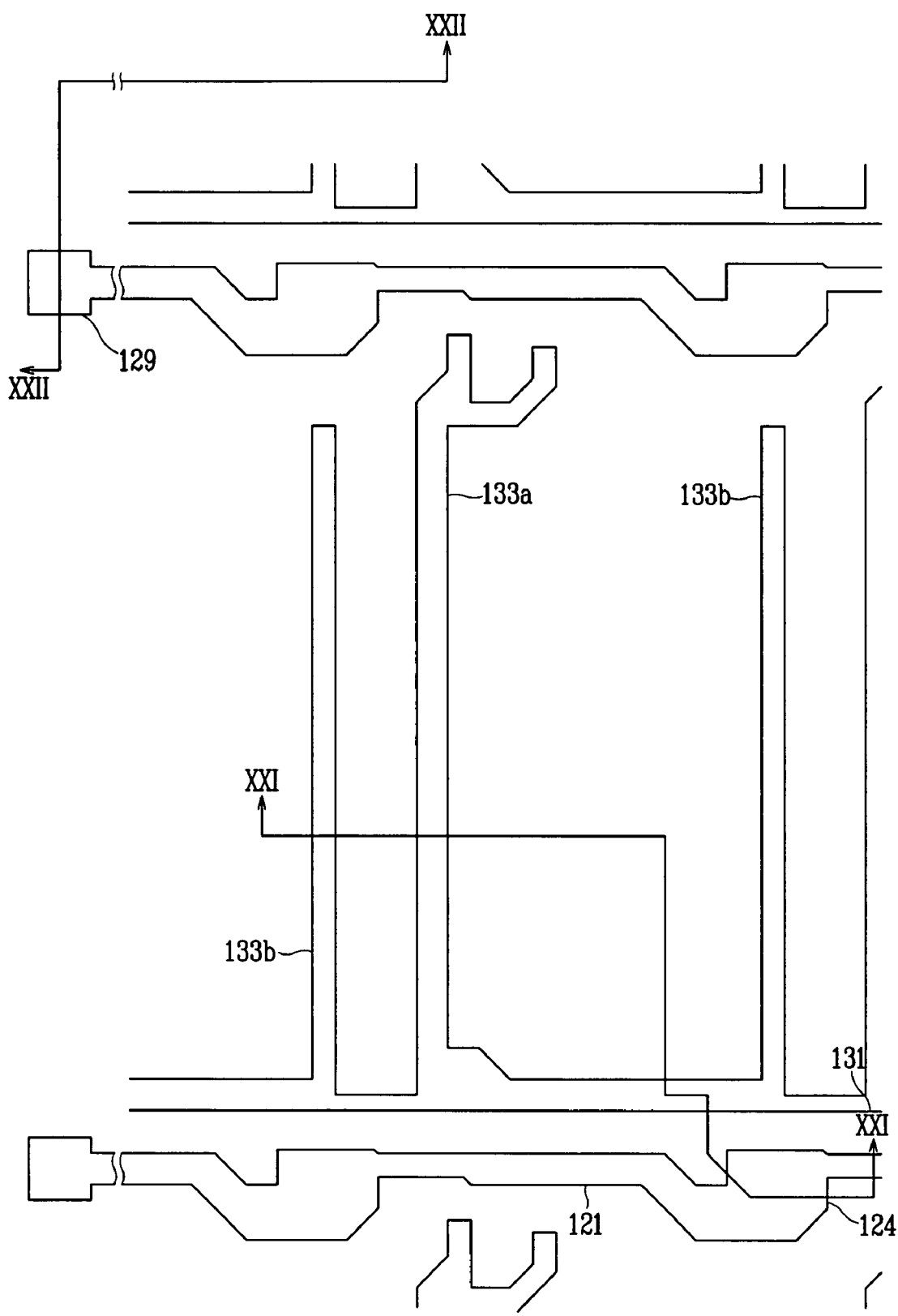
FIG. 20, FIG. 23, and FIG. 26 show layouts of the TFT array panel at intermediate stages of manufacturing according to an embodiment of the present invention.
Figure 21:
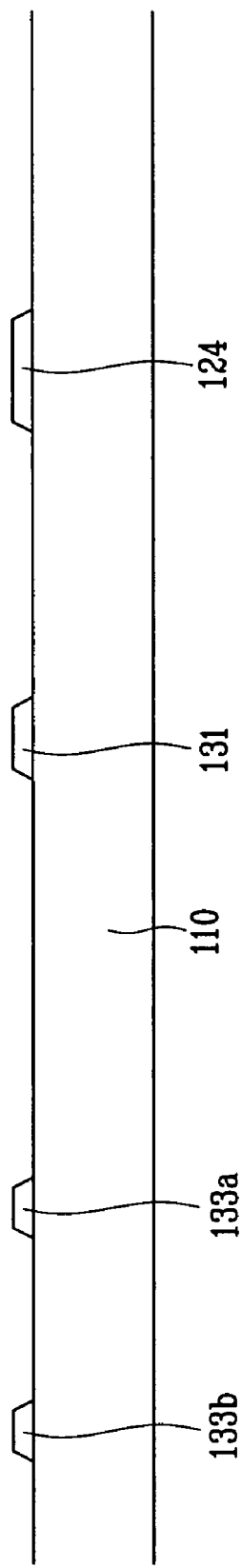
FIG. 21 and FIG. 22 are cross-sectional views of the TFT array panel shown in FIG. 20 taken along the lines XXI-XXI and XXII-XXII, respectively.
Figure 22:
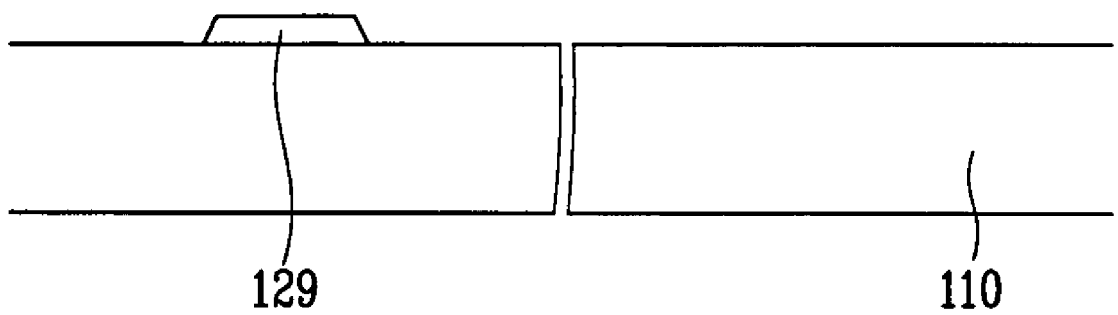
Figure 23:
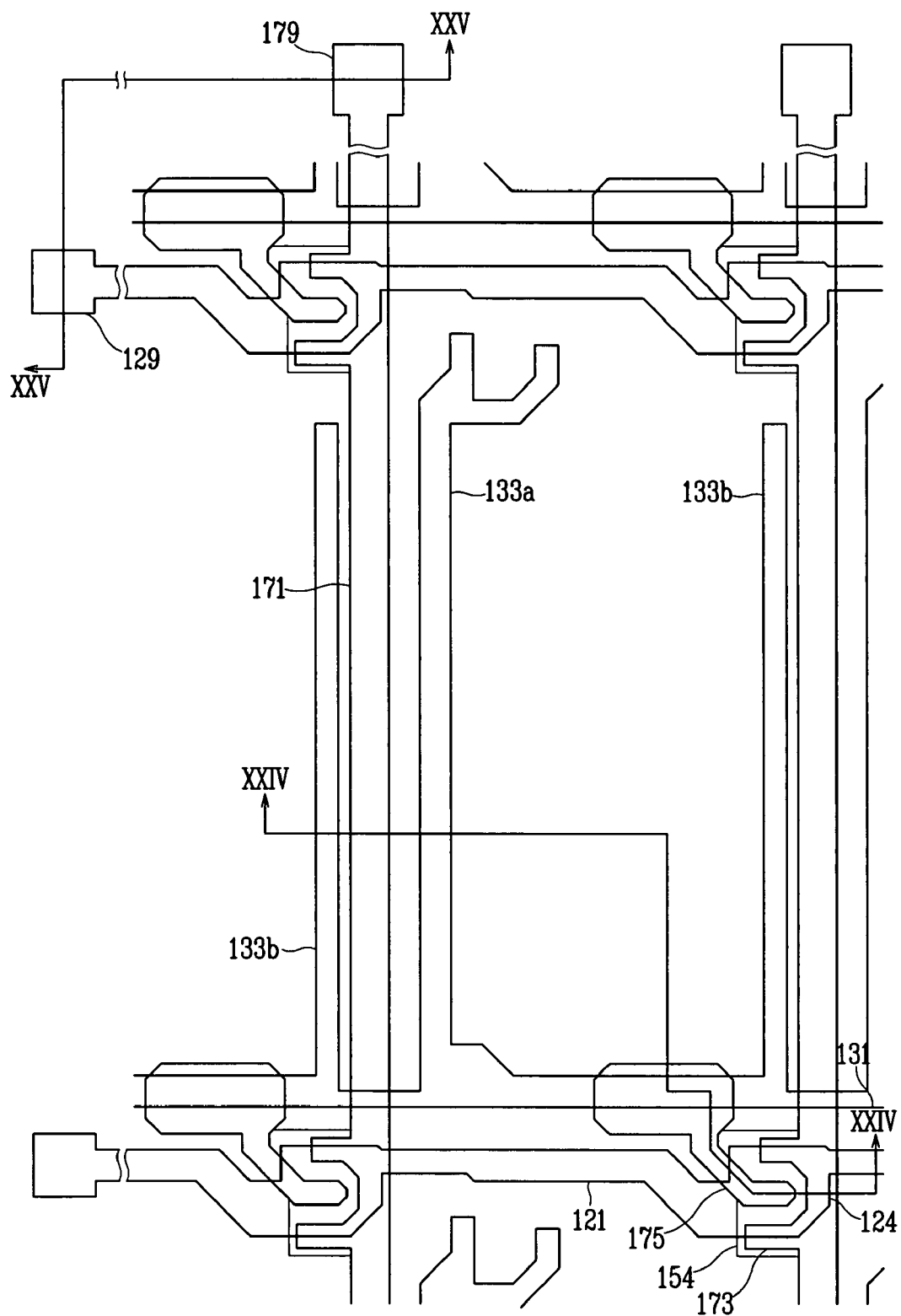
Figure 24:
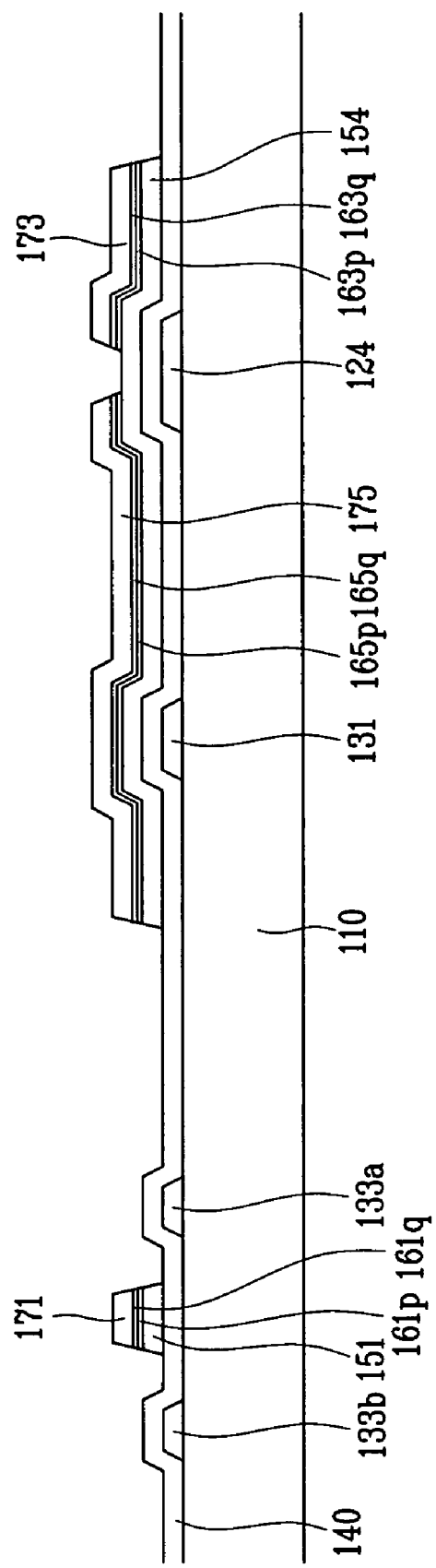
FIG. 24 and FIG. 25 are cross-sectional views of the TFT array panel shown in FIG. 23 taken along the lines XXIV-XXIV and XXV-XXV, respectively.
Figure 25:
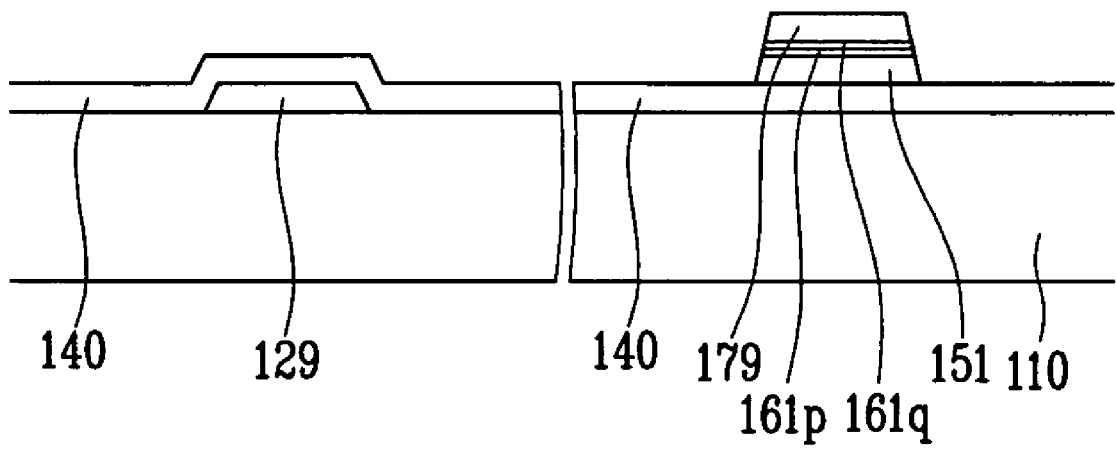
Figure 26:
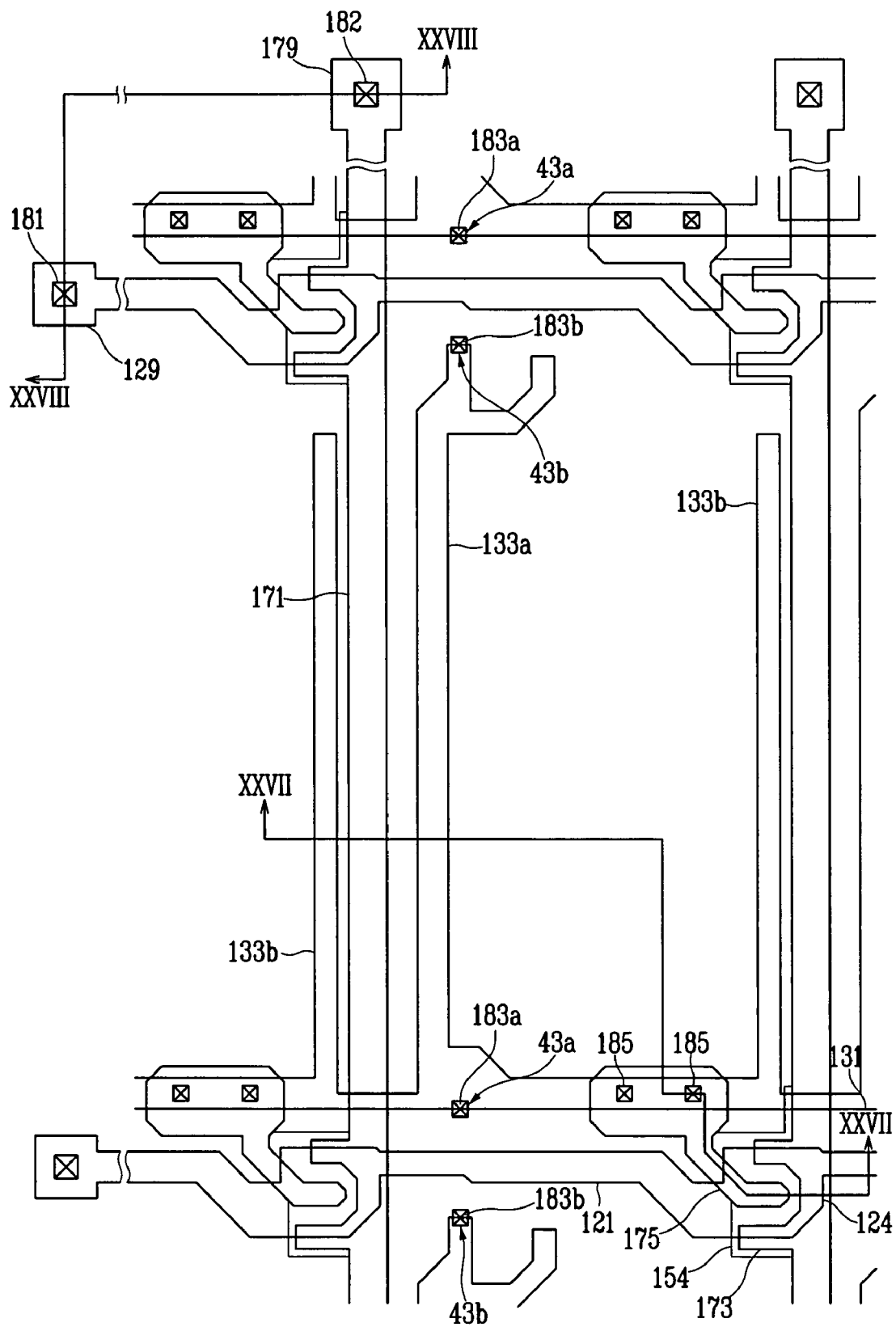
Figure 27:
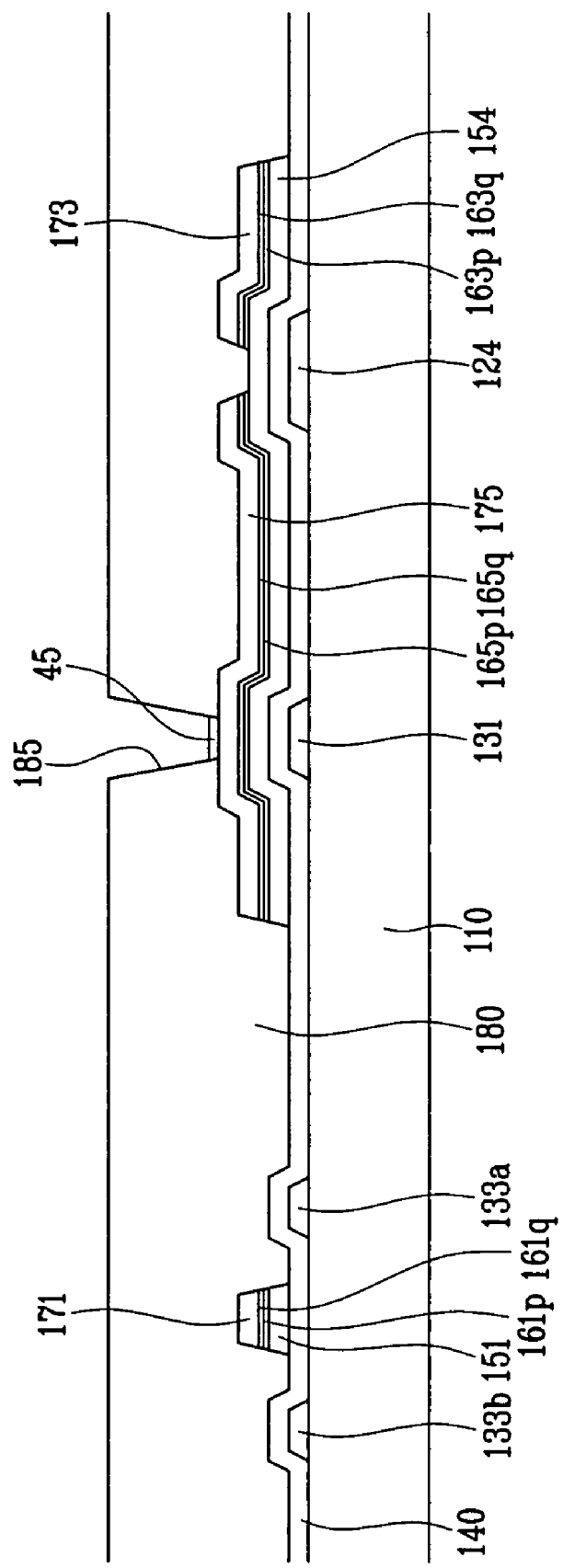
FIG. 27 and FIG. 28 are cross-sectional views of the TFT array panel shown in FIG. 26 taken along the lines XXVII-XXVII and XXVIII-XXVIII, respectively.
Figure 28:
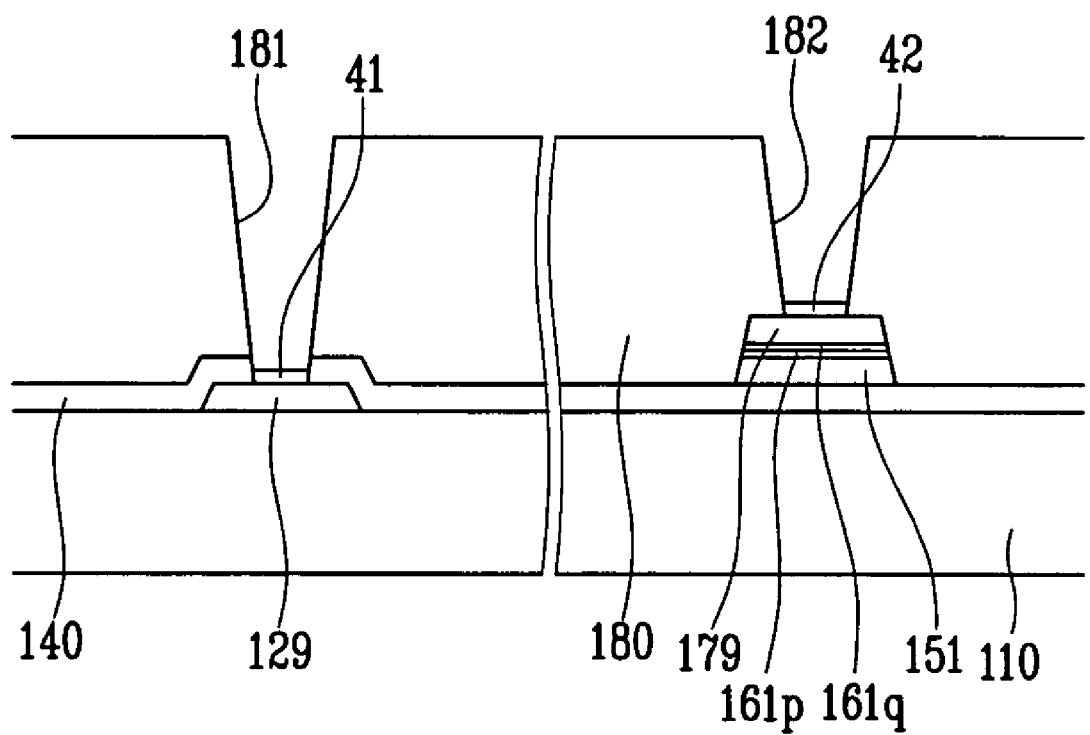

FIG. 20, FIG. 23, and FIG. 26 are layout views of the TFT array panel at intermediate stages of manufacturing according to an embodiment of the present invention, FIG. 21 and FIG. 22 are cross-sectional views of the TFT array panel shown in FIG. 20 taken along the lines XXI-XXI and XXII-XXII, FIG. 24 and FIG. 25 are cross-sectional views of the TFT array panel shown in FIG. 23 taken along the lines XXIV-XXIV and XXV-XXV, and FIG. 27 and FIG. 28 are cross-sectional views of the TFT array panel shown in FIG. 26 taken along the lines XXVII-XXVII and XXVIII-XXVIII.

Referring to FIG. 20 to FIG. 22, a conductive layer including an aluminum containing metal or a copper containing metal, etc. is deposited on an insulating substrate 110 by sputtering, etc., and the conductive layer is patterned by photolithography and etching to form a plurality of gate lines 121 including gate electrodes 124 and end portions 129 and a plurality of storage electrode lines 131 including first and second storage electrodes 133a and 133b.

Next, a gate insulating layer 140, an intrinsic a-Si layer, an extrinsic a-Si layer, and a nitrogen-containing layer are sequentially deposited by CVD, etc. A conductive layer including an aluminum containing metal or a copper containing metal, etc is then deposited by sputtering, etc.

Referring to FIG. 23 to FIG. 25, the conductive layer, the nitrogen-containing layer, the extrinsic a-Si layer, and the intrinsic a-Si layer are patterned by one photolithography step and by several etching steps to form a plurality of data lines 171 including source electrodes 173 and end portions 179 and a plurality of drain electrodes 175, upper films 161q and 165q and lower films 161p and 165p of a plurality of ohmic contacts 161 and 165, and a plurality of (intrinsic) semiconductor stripes 151 including projections 154. The ohmic contacts 161 include projections 163 that include lower films 163p and upper films 165q.

Here, a photoresist (not shown) used in the photolithography step has a position-dependent thickness. The photosensitive film pattern has first portions and second portions having different thicknesses. The first portions are located on wire areas that are occupied by the data lines 171 and the drain electrodes 175, while the second portions are located on channel areas of TFTs. Often, the first portions are thicker than the second portions.

The position-dependent thickness of the photoresist film is obtained by several techniques, for example by providing translucent areas on a photo mask as well as light transmitting transparent areas and light blocking opaque areas. The translucent areas may be formed with a slit pattern, a lattice pattern, or a thin film(s) with intermediate transmittance or intermediate thickness. When using a slit pattern, it is preferable that the width of the slits or the distance between the slits be smaller than the resolution of a light exposer used for the photolithography. Another example is to use a reflowable photosensitive film. In detail, once a photoresist made of a reflowable material is formed by using a normal photo mask with only transparent areas and opaque areas, it is subjected to a reflow process to flow onto areas without the photoresist, thereby forming thin portions.

In more detail, exposed portions of the conductive layer, which are not covered with the photoresist, and underlying portions of the nitrogen compound layer, the extrinsic a-Si layer, and the intrinsic a-Si layer thereunder are removed by dry etching.

Next, the second portions of the photoresist on the channel areas are removed. At this time, the first portions of the photoresist become thin. Then, exposed portions of the conductive layer on the channel areas are removed to separate the conductive layer into the data lines 173 and the drain electrodes 175 and to expose underlying portions of the extrinsic a-Si layer on the channel areas. The exposed portions of the extrinsic a-Si layer are removed to form the ohmic contacts 161 and 165 and to expose portions of the intrinsic semiconductor stripes 154.

As shown in FIG. 26 to FIG. 28, a passivation layer 180 is deposited and the passivation layer 180 and the gate insulating layer 140 are patterned by lithography and etching to form a plurality of contact holes 181, 182, 183a, 183b, and 185. A plurality of buffer members 41, 42, 43a, 43b, and 45 are formed in the contact holes 181, 182, 183a, 183b, and 185, maybe using the process steps shown in FIGS. 16A-16E.

Finally, a plurality of contact assistants 81 and 82, a plurality of overpasses 83, and a plurality of pixel electrodes 191 are formed on the passivation layer 180 and on the buffer members 41, 42, 43a, 43b, and 45 as shown in FIG. 17 to FIG. 19.

Figure 29:
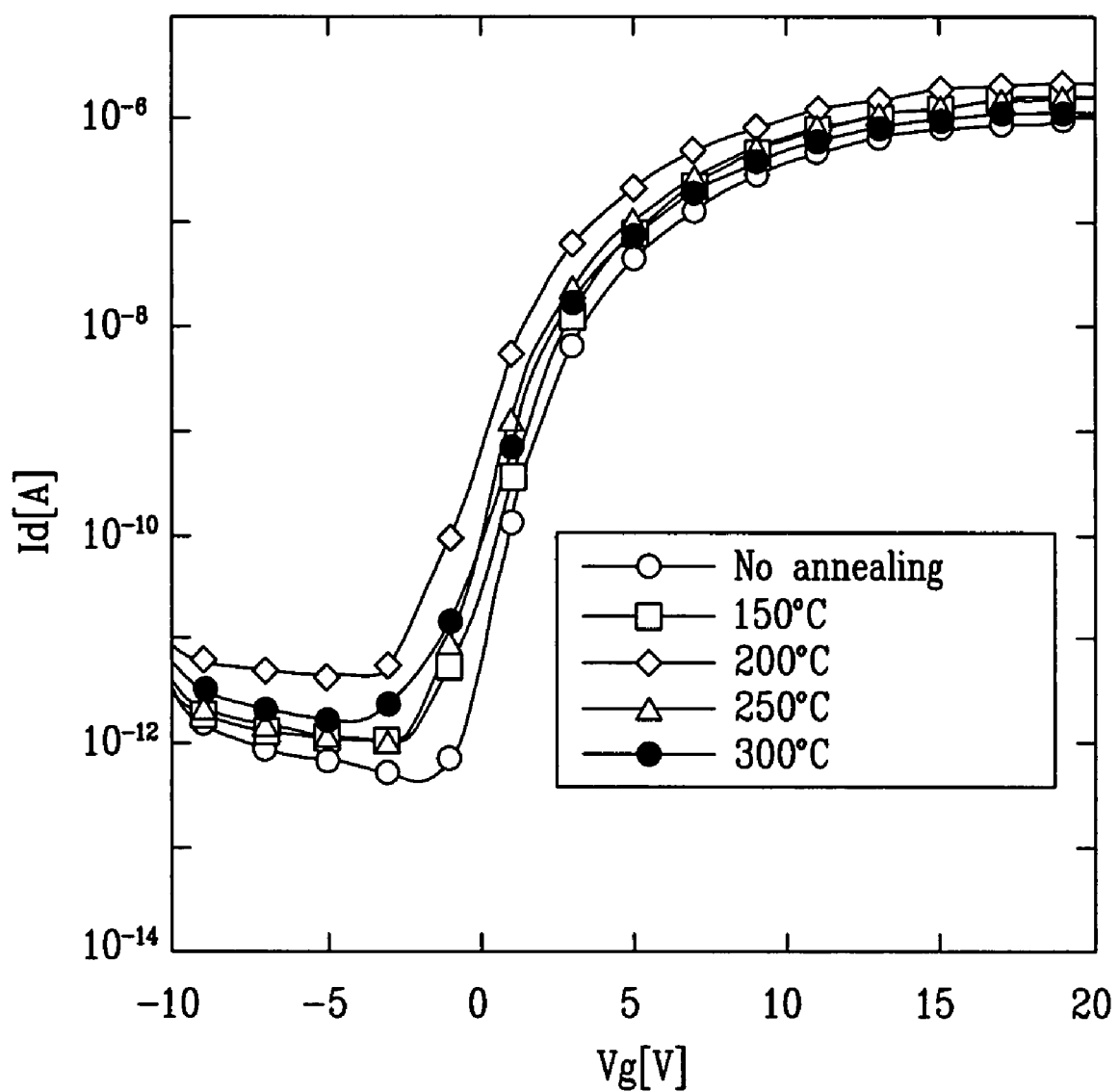
FIG. 29 is a graph showing a performance variation of the thin film transistor according to an experimental example of the present invention.

Now, a performance characteristic variation of a TFT according to an experimental example according to the present invention will be described in reference to FIG. 29. FIG. 29 is a graph showing a performance characteristic variation of a TFT according to an experimental example of the present invention.

In this experimental example, for measuring the effects of the barrier layer including nitrogen on the performance characteristic of the TFT, a nitrogen compound layer was formed on a semiconductor layer of the TFTs and heat-treated at different temperatures such as about 150° C. (case 1), about 200° C. (case 2), about 250° C. (case 3), and about 300° C. (case 4). Next, the source electrode and the drain electrode including aluminum or aluminum alloys or copper or copper alloys of the TFTs were formed on the heat-treated nitrogen compound layer to complete the TFTs. Then, current-voltage curves (I-V curves) of the TFTs for cases 1-5 were obtained as shown in FIG. 29.

Referring to FIG. 29, the current characteristics of the TFTs according to cases 1 to 5 were almost equal, and the current characteristics satisfy desirable current characteristics of a TFT for an LCD.

Accordingly, the TFTs according to embodiments of the present invention, including the ohmic contacts containing nitrogen, can have desirable current characteristics.

In addition, the heat treatment of a TFT including the nitrogen in the ohmic contacts may not affect the current characteristic of the TFT.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method of manufacturing a thin film transistor array panel, the method comprising:
   forming a gate line having a single-layered structure on a substrate;
   forming a gate insulating layer on the gate line;
   forming a semiconductor layer on the gate insulating layer;
   forming a barrier layer including nitrogen on the semiconductor layer;
   forming a data line including a source electrode and a drain electrode on the barrier layer, the data line and the drain electrode having a single-layered structure;
   forming a passivation layer having a first contact hole extending to a predetermined portion of the data line and a second contact hole exposing the drain electrode; and
   forming a pixel electrode electrically connected to the drain electrode on the passivation layer.

2. The method of claim 1, wherein the gate line and the data line are made of the same material.

3. The method of claim 2, wherein the gate line and the data line comprise aluminum or an aluminum alloy.

4. The method of claim 1, further comprising:
   forming a first buffer member disposed on the predetermined portion of the data line and in the first contact hole and a second buffer member disposed between the drain electrode and the pixel electrode and in the second contact hole.

5. The method of claim 4, wherein
   the formation of the passivation layer and the formation of the first and the second buffer members comprise:
   depositing the passivation layer;
   forming a photoresist film on the passivation layer;
   etching the passivation layer using the photoresist film as an etch mask to form the first and the second contact holes;
   depositing a conductive layer on the photoresist film and in the contact holes; and
   removing the photoresist film with portions of the conductive layer disposed on the photoresist film to leave the first and the second buffer members in the first and the second contact holes.

6. The method of claim 4, wherein
   the first and the second buffer members comprise molybdenum or a molybdenum alloy.

7. The method of claim 1, wherein the formation of the barrier layer comprises treating the semiconductor layer using a plasma including nitrogen.

8. A thin film transistor array panel comprising:
   a substrate;
   a gate line including a gate electrode formed on the substrate and having a single-layered structure;
   a gate insulating layer formed on the gate line;
   a semiconductor layer formed on the gate insulating layer;
   a barrier layer formed on the semiconductor layer and including nitrogen;
   a data line including a source electrode formed on the baffler layer and having a single-layered structure;
   a drain electrode formed on the barrier layer, spaced apart from the source electrode, and having a single-layered structure; and
   a pixel electrode electrically connected to the drain electrode.

9. The thin film transistor array panel of claim 8, wherein the gate line and the data line comprise the same material.

10. The thin film transistor array panel of claim 9, wherein the gate line and the data line comprise aluminum or an aluminum alloy.

11. The thin film transistor array panel of claim 9, wherein the gate line and the data line comprise copper or a copper alloy.

12. The thin film transistor array panel of claim 8, further comprising:
   a passivation layer formed between the drain electrode and the pixel electrode and having a first contact hole exposing the drain electrode; and
   a first buffer member interposed between the drain electrode and the pixel electrode and disposed in the first contact hole,
   wherein the electrical connection between the pixel electrode and the drain electrode is obtained via the first buffer member.

13. The thin film transistor array panel of claim 12, wherein the first buffer member comprises molybdenum or a molybdenum alloy.

14. The thin film transistor array panel of claim 12, wherein the passivation layer and the gate insulating layer have a second contact hole exposing a portion of the gate line and the passivation layer has a third contact hole extending to a predetermined portion of the data line,
and wherein the thin film transistor array panel further comprises:
   a second buffer member disposed on the predetermined portion of the gate line and in the second contact hole; and a third buffer member disposed on the predetermined portion of the data line and in the third contact hole.

15. The thin film transistor array panel of claim 14, further comprising:
   a first contact assistant formed on the second buffer member; and
   a second contact assistant formed on the third buffer member.

16. The thin film transistor array panel of claim 14, wherein the second buffer member and the third buffer member comprise molybdenum or a molybdenum alloy.

17. The thin film transistor array panel of claim 8, wherein the barrier layer comprises silicon.

18. The thin film transistor array panel of claim 17, wherein the barrier layer comprises phosphorus.

19. A thin film transistor array panel comprising:
   a substrate;
   a gate electrode disposed on the substrate and having a single-layered structure;
   a gate insulating layer disposed on the gate electrode;
   an intrinsic semiconductor layer disposed on the gate insulating layer;
   a source electrode disposed on the intrinsic semiconductor layer and having a single-layered structure;
   a drain electrode disposed on the intrinsic semiconductor layer, spaced apart from the source electrode, and having a single-layered structure; and
   a first extrinsic semiconductor member interposed between the intrinsic semiconductor layer and the source electrode and comprising nitrogen;
   a second extrinsic semiconductor member interposed between the intrinsic semiconductor layer and the drain electrode and comprising nitrogen; and
   a pixel electrode electrically connected to the drain electrode.

20. A thin film transistor array panel comprising:
   a substrate;
   a gate line including a gate electrode formed on the substrate and having a single-layered structure comprising aluminum;
   a gate insulating layer formed on the gate line;
   a semiconductor layer formed on the gate insulating layer;
   a barrier layer formed on the semiconductor layer and including nitrogen;
   a data line including a source electrode formed on the barrier layer having a single-layered structure comprising aluminum;
   a drain electrode formed on the barrier layer, spaced apart from the source electrode, and having a single-layered structure comprising aluminum;
   a passivation layer formed on the drain electrode and having a first contact hole exposing the drain electrode;
   a first buffer member disposed in the first contact hole; and
   a pixel electrode electrically connected to the drain electrode.

* * * * *